(12) United States Patent
Haig et al.

(10) Patent No.: US 10,847,212 B1
(45) Date of Patent: Nov. 24, 2020

(54) READ AND WRITE DATA PROCESSING CIRCUITS AND METHODS ASSOCIATED WITH COMPUTATIONAL MEMORY CELLS USING TWO READ MULTIPLEXERS

(71) Applicant: GSI Technology, Inc., Sunnyvale, CA (US)

(72) Inventors: Bob Haig, Sunnyvale, CA (US); Eli Ehrman, Sunnyvale, CA (US); Chao-Hung Chang, Sunnyvale, CA (US); Mu-Hsiang Huang, Sunnyvale, CA (US)

(73) Assignee: GSI Technology, Inc., Sunnyvale, CA (US)

( * ) Notice: Subject to any disclaimer, the term of this patent is extended or adjusted under 35 U.S.C. 154(b) by 0 days.

(21) Appl. No.: 16/111,181

(22) Filed: Aug. 23, 2018

Related U.S. Application Data

(63) Continuation-in-part of application No. 15/709,399, filed on Sep. 19, 2017, which is a continuation-in-part of application No. 15/709,401, filed on Sep. 19, 2017, now Pat. No. 10,249,362, application No. 16/111,181, filed on Aug. 23, 2018, which is a continuation-in-part of application No. 15/709,379, filed on Sep. 19, 2017, now Pat. No. 10,521,229, application No. 16/111,181, filed on Aug. 23, 2018, (Continued)

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ..... G11C 11/41; G11C 11/416; G11C 11/418; G11C 11/419
See application file for complete search history.

(56) References Cited

U.S. PATENT DOCUMENTS 3,451,694 A   6/1969   Hass
3,747,952 A   7/1973   Graebe
(Continued)

FOREIGN PATENT DOCUMENTS

CN      104752431        7/2015
DE      10133281 A1      1/2002
JP      2005-346922     12/2005

OTHER PUBLICATIONS

US 10,564,982 B1, 02/2020, Oh et al. (withdrawn)

*Primary Examiner* — Alfredo Bermudez Lozada

(57) ABSTRACT

A read and write data processing apparatus and method associated with computational memory cells formed as a memory/processing array provides the ability for selected write data in a bit line section to be logically combined (e.g. logically ANDed) with the read result on a read bit line, as if the write data were the read data output of another computational memory cell being read during the read operation. When accumulation logic is implemented in the bit line sections, the implementation and utilization of additional read logic circuitry provides a mechanism for selected write data in a bit line section to be used as the data with which the read result on the read bit line accumulates, before the newly accumulated result is captured and stored in the bit line section's read register.

30 Claims, 11 Drawing Sheets

Related U.S. Application Data which is a continuation-in-part of application No. 15/709,382, filed on Sep. 19, 2017, application No. 16/111,181, filed on Aug. 23, 2018, which is a continuation-in-part of application No. 15/709,385, filed on Sep. 19, 2017.

(60) Provisional application No. 62/430,767, filed on Dec. 6, 2016, provisional application No. 62/430,762, filed on Dec. 6, 2016.

(56) References Cited

U.S. PATENT DOCUMENTS

| | | | |
|---|---|---|---|
| 3,795,412 A | 3/1974 | John | |
| 4,227,717 A | 10/1980 | Bouvier | |
| 4,308,505 A | 12/1981 | Messerschmitt | |
| 4,587,496 A | 5/1986 | Wolaver | |
| 4,594,564 A | 6/1986 | Yarborough, Jr. | |
| 4,677,394 A | 6/1987 | Vollmer | |
| 4,716,322 A | 12/1987 | D'Arrigo et al. | |
| 4,741,006 A | 4/1988 | Yamaguchi et al. | |
| 4,856,035 A | 8/1989 | Lewis | |
| 5,008,636 A | 4/1991 | Markinson | |
| 5,302,916 A | 4/1994 | Pritchett | |
| 5,375,089 A | 12/1994 | Lo | |
| 5,382,922 A | 1/1995 | Gersbach | |
| 5,400,274 A | 3/1995 | Jones | |
| 5,473,574 A | 12/1995 | Clemen et al. | |
| 5,530,383 A | 6/1996 | May | |
| 5,535,159 A | 7/1996 | Nii | |
| 5,563,834 A | 10/1996 | Longway et al. | |
| 5,587,672 A | 12/1996 | Ranganathan et al. | |
| 5,608,354 A | 3/1997 | Hori | |
| 5,661,419 A | 8/1997 | Bhagwan | |
| 5,696,468 A | 12/1997 | Nise | |
| 5,736,872 A | 4/1998 | Sharma et al. | |
| 5,744,979 A | 4/1998 | Goetting | |
| 5,744,991 A | 4/1998 | Jefferson et al. | |
| 5,748,044 A | 5/1998 | Xue | |
| 5,768,559 A | 6/1998 | Iino et al. | |
| 5,805,912 A | 9/1998 | Johnson et al. | |
| 5,883,853 A | 3/1999 | Zheng et al. | |
| 5,937,204 A | 8/1999 | Schinnerer | |
| 5,942,949 A | 8/1999 | Wilson et al. | |
| 5,963,059 A | 10/1999 | Partovi et al. | |
| 5,969,576 A | 10/1999 | Trodden | |
| 5,969,986 A | 10/1999 | Wong | |
| 5,977,801 A | 11/1999 | Boerstler | |
| 5,999,458 A | 12/1999 | Nishimura et al. | |
| 6,005,794 A | 12/1999 | Sheffield et al. | |
| 6,044,034 A | 3/2000 | Katakura | |
| 6,058,063 A | 5/2000 | Jang | |
| 6,072,741 A | 6/2000 | Taylor | |
| 6,100,721 A | 8/2000 | Durec et al. | |
| 6,100,736 A | 8/2000 | Wu et al. | |
| 6,114,920 A | 9/2000 | Moon et al. | |
| 6,115,320 A | 9/2000 | Mick et al. | |
| 6,133,770 A | 10/2000 | Hasegawa | |
| 6,167,487 A | 12/2000 | Camacho | |
| 6,175,282 B1 | 1/2001 | Yasuda | |
| 6,226,217 B1 | 5/2001 | Riedlinger et al. | |
| 6,262,937 B1 | 7/2001 | Arcoleo et al. | |
| 6,263,452 B1 | 7/2001 | Jewett et al. | |
| 6,265,902 B1 | 7/2001 | Klemmer et al. | |
| 6,286,077 B1 | 9/2001 | Choi et al. | |
| 6,310,880 B1 | 10/2001 | Waller | |
| 6,366,524 B1 | 4/2002 | Abedifard | |
| 6,377,127 B1 | 4/2002 | Fukaishi et al. | |
| 6,381,684 B1 | 4/2002 | Hronik et al. | |
| 6,385,122 B1 | 5/2002 | Chang | |
| 6,407,642 B2 | 6/2002 | Dosho et al. | |
| 6,418,077 B1 | 7/2002 | Naven | |
| 6,441,691 B1 | 8/2002 | Jones et al. | |
| 6,448,757 B2 | 9/2002 | Hill | |
| 6,473,334 B1 | 10/2002 | Bailey et al. | |
| 6,483,361 B1 | 11/2002 | Chiu | |
| 6,504,417 B1 | 1/2003 | Cecchi et al. | |
| 6,538,475 B1 | 3/2003 | Johansen et al. | |
| 6,567,338 B1 | 5/2003 | Mick | |
| 6,594,194 B2 | 7/2003 | Gold | |
| 6,642,747 B1 | 11/2003 | Chiu | |
| 6,661,267 B2 | 12/2003 | Walker et al. | |
| 6,665,222 B2 | 12/2003 | Wright et al. | |
| 6,683,502 B1 | 1/2004 | Groen et al. | |
| 6,683,930 B1 | 1/2004 | Dalmia | |
| 6,732,247 B2 | 5/2004 | Berg et al. | |
| 6,744,277 B1 | 6/2004 | Chang et al. | |
| 6,757,854 B1 | 6/2004 | Zhao | |
| 6,789,209 B1 | 9/2004 | Suzuki et al. | |
| 6,816,019 B2 | 11/2004 | Delbo' et al. | |
| 6,836,419 B2 | 12/2004 | Loughmiller | |
| 6,838,951 B1 | 1/2005 | Nieri et al. | |
| 6,842,396 B2 | 1/2005 | Kono | |
| 6,853,696 B1 | 2/2005 | Moser et al. | |
| 6,854,059 B2 | 2/2005 | Gardner | |
| 6,856,202 B2 | 2/2005 | Lesso | |
| 6,859,107 B1 | 2/2005 | Moon et al. | |
| 6,882,237 B2 | 4/2005 | Singh et al. | |
| 6,897,696 B2 | 5/2005 | Chang et al. | |
| 6,933,789 B2 | 8/2005 | Molnar et al. | |
| 6,938,142 B2 | 8/2005 | Pawlowski | |
| 6,940,328 B2 | 9/2005 | Lin | |
| 6,954,091 B2 | 10/2005 | Wurzer | |
| 6,975,554 B1 | 12/2005 | Lapidus et al. | |
| 6,998,922 B2 | 2/2006 | Jensen et al. | |
| 7,002,404 B2 | 2/2006 | Gaggl et al. | |
| 7,002,416 B2 | 2/2006 | Pettersen et al. | |
| 7,003,065 B2 | 2/2006 | Homol et al. | |
| 7,017,090 B2 | 3/2006 | Endou et al. | |
| 7,019,569 B2 | 3/2006 | Fan-Jiang | |
| 7,042,271 B2 | 5/2006 | Chung et al. | |
| 7,042,792 B2 | 5/2006 | Lee et al. | |
| 7,042,793 B2 | 5/2006 | Masuo | |
| 7,046,093 B1 | 5/2006 | McDonagh et al. | |
| 7,047,146 B2 | 5/2006 | Chuang et al. | |
| 7,053,666 B2 | 5/2006 | Tak et al. | |
| 7,095,287 B2 | 8/2006 | Maxim et al. | |
| 7,099,643 B2 | 8/2006 | Lin | |
| 7,141,961 B2 | 11/2006 | Hirayama et al. | |
| 7,142,477 B1 | 11/2006 | Tran et al. | |
| 7,152,009 B2 | 12/2006 | Bokui et al. | |
| 7,180,816 B2 | 2/2007 | Park | |
| 7,200,713 B2 | 4/2007 | Cabot et al. | |
| 7,218,157 B2 | 5/2007 | Van De Beek et al. | |
| 7,233,214 B2 | 6/2007 | Kim et al. | |
| 7,246,215 B2 | 7/2007 | Lu et al. | |
| 7,263,152 B2 | 8/2007 | Miller et al. | |
| 7,269,402 B2 | 9/2007 | Uozumi et al. | |
| 7,282,999 B2 | 10/2007 | Da Dalt et al. | |
| 7,312,629 B2 | 12/2007 | Chuang et al. | |
| 7,313,040 B2 | 12/2007 | Chuang et al. | |
| 7,330,080 B1 | 2/2008 | Stoiber et al. | |
| 7,340,577 B1 | 3/2008 | Van Dyke et al. | |
| 7,349,515 B1 | 3/2008 | Chew et al. | |
| 7,352,249 B2 | 4/2008 | Balboni et al. | |
| 7,355,482 B2 | 4/2008 | Meltzer | |
| 7,355,907 B2 | 4/2008 | Chen et al. | |
| 7,369,000 B2 | 5/2008 | Wu et al. | |
| 7,375,593 B2 | 5/2008 | Self | |
| 7,389,457 B2 | 6/2008 | Chen et al. | |
| 7,439,816 B1 | 10/2008 | Lombaard | |
| 7,463,101 B2 | 12/2008 | Tung | |
| 7,464,282 B1 | 12/2008 | Abdollahi-Alibeik et al. | |
| 7,487,315 B2 | 2/2009 | Hur et al. | |
| 7,489,164 B2 | 2/2009 | Madurawe | |
| 7,512,033 B2 | 3/2009 | Hur et al. | |
| 7,516,385 B2 | 4/2009 | Chen et al. | |
| 7,538,623 B2 | 5/2009 | Jensen et al. | |
| 7,545,223 B2 | 6/2009 | Watanabe | |
| 7,565,480 B2 | 7/2009 | Ware et al. | |
| 7,577,225 B2 | 8/2009 | Azadet et al. | |
| 7,592,847 B2 | 9/2009 | Liu et al. | |
| 7,595,657 B2 | 9/2009 | Chuang et al. | |
| 7,622,996 B2 | 11/2009 | Liu | |

(56) References Cited

U.S. PATENT DOCUMENTS

| | | |
|---|---|---|
| 7,630,230 B2 | 12/2009 | Wong |
| 7,633,322 B1 | 12/2009 | Zhuang et al. |
| 7,635,988 B2 | 12/2009 | Madurawe |
| 7,646,215 B2 | 1/2010 | Chuang et al. |
| 7,646,648 B2 | 1/2010 | Arsovski |
| 7,659,783 B2 | 2/2010 | Tai |
| 7,660,149 B2 | 2/2010 | Liaw |
| 7,663,415 B2 | 2/2010 | Chatterjee et al. |
| 7,667,678 B2 | 2/2010 | Guttag |
| 7,675,331 B2 | 3/2010 | Jung et al. |
| 7,719,329 B1 | 5/2010 | Smith |
| 7,719,330 B2 | 5/2010 | Lin et al. |
| 7,728,675 B1 | 6/2010 | Kennedy et al. |
| 7,737,743 B1 | 6/2010 | Gao et al. |
| 7,746,181 B1 | 6/2010 | Moyal |
| 7,746,182 B2 | 6/2010 | Ramaswamy et al. |
| 7,750,683 B2 | 7/2010 | Huang et al. |
| 7,760,032 B2 | 7/2010 | Ardehali |
| 7,760,040 B2 | 7/2010 | Zhang et al. |
| 7,760,532 B2 | 7/2010 | Shirley et al. |
| 7,782,655 B2 | 8/2010 | Shau |
| 7,812,644 B2 | 10/2010 | Cha et al. |
| 7,830,212 B2 | 11/2010 | Lee et al. |
| 7,839,177 B1 | 11/2010 | Soh |
| 7,843,239 B2 | 11/2010 | Sohn et al. |
| 7,843,721 B1 | 11/2010 | Chou |
| 7,848,725 B2 | 12/2010 | Zolfaghari et al. |
| 7,859,919 B2 | 12/2010 | De La Cruz, II et al. |
| 7,876,163 B2 | 1/2011 | Hachigo |
| 7,916,554 B2 | 3/2011 | Pawlowski |
| 7,920,409 B1 | 4/2011 | Clark |
| 7,920,665 B1 | 4/2011 | Lombaard |
| 7,924,599 B1 | 4/2011 | Evans, Jr. et al. |
| 7,940,088 B1 | 5/2011 | Sampath et al. |
| 7,944,256 B2 | 5/2011 | Masuda |
| 7,956,695 B1 | 6/2011 | Ding et al. |
| 7,965,108 B2 | 6/2011 | Liu et al. |
| 8,004,920 B2 | 8/2011 | Ito et al. |
| 8,008,956 B1 | 8/2011 | Shin et al. |
| 8,044,724 B2 | 10/2011 | Rao et al. |
| 8,063,707 B2 | 11/2011 | Wang |
| 8,087,690 B2 | 1/2012 | Kim |
| 8,089,819 B2 | 1/2012 | Noda |
| 8,117,567 B2 | 2/2012 | Arsovski |
| 8,174,332 B1 | 5/2012 | Lombaard et al. |
| 8,218,707 B2 | 7/2012 | Mai |
| 8,242,820 B2 | 8/2012 | Kim |
| 8,258,831 B1 | 9/2012 | Banai |
| 8,284,593 B2 | 10/2012 | Russell |
| 8,294,502 B2 | 10/2012 | Lewis et al. |
| 8,400,200 B1 | 3/2013 | Kim et al. |
| 8,488,408 B1 | 7/2013 | Shu et al. |
| 8,493,774 B2 | 7/2013 | Kung |
| 8,526,256 B2 | 9/2013 | Gosh |
| 8,542,050 B2 | 9/2013 | Chuang et al. |
| 8,575,982 B1 | 11/2013 | Shu et al. |
| 8,593,860 B2 | 11/2013 | Shu et al. |
| 8,625,334 B2 | 1/2014 | Liaw |
| 8,643,418 B2 | 2/2014 | Ma et al. |
| 8,692,621 B2 | 4/2014 | Snowden et al. |
| 8,693,236 B2 | 4/2014 | Shu |
| 8,817,550 B1 | 8/2014 | Oh |
| 8,837,207 B1 | 9/2014 | Jou |
| 8,885,439 B1 | 11/2014 | Shu et al. |
| 8,971,096 B2 | 3/2015 | Jung et al. |
| 8,995,162 B2 | 3/2015 | Sang |
| 9,018,992 B1 | 4/2015 | Shu et al. |
| 9,030,893 B2 | 5/2015 | Jung |
| 9,053,768 B2 | 6/2015 | Shu et al. |
| 9,059,691 B2 | 6/2015 | Lin |
| 9,070,477 B1 | 6/2015 | Clark |
| 9,083,356 B1 | 7/2015 | Cheng |
| 9,093,135 B2 | 7/2015 | Khailany |
| 9,094,025 B1 | 7/2015 | Cheng |
| 9,135,986 B2 | 9/2015 | Shu |
| 9,142,285 B2 | 9/2015 | Hwang et al. |
| 9,159,391 B1 | 10/2015 | Shu et al. |
| 9,171,634 B2 | 10/2015 | Zheng |
| 9,177,646 B2 | 11/2015 | Arsovski |
| 9,196,324 B2 | 11/2015 | Haig et al. |
| 9,240,229 B1 | 1/2016 | Oh et al. |
| 9,311,971 B1 | 4/2016 | Oh |
| 9,318,174 B1 | 4/2016 | Chuang et al. |
| 9,356,611 B1 | 5/2016 | Shu et al. |
| 9,384,822 B2 | 7/2016 | Shu et al. |
| 9,385,032 B2 | 7/2016 | Shu |
| 9,396,790 B1 | 7/2016 | Chhabra |
| 9,396,795 B1 | 7/2016 | Jeloka et al. |
| 9,401,200 B1 | 7/2016 | Chan |
| 9,412,440 B1 | 8/2016 | Shu et al. |
| 9,413,295 B1 | 8/2016 | Chang |
| 9,431,079 B1 | 8/2016 | Shu et al. |
| 9,443,575 B2 | 9/2016 | Yabuuchi |
| 9,484,076 B1 | 11/2016 | Shu et al. |
| 9,494,647 B1 | 11/2016 | Chuang et al. |
| 9,552,872 B2 | 1/2017 | Jung |
| 9,608,651 B1 | 3/2017 | Cheng |
| 9,613,670 B2 | 4/2017 | Chuang et al. |
| 9,613,684 B2 | 4/2017 | Shu et al. |
| 9,679,631 B2 | 6/2017 | Haig et al. |
| 9,685,210 B1 | 6/2017 | Ghosh et al. |
| 9,692,429 B1 | 6/2017 | Chang et al. |
| 9,697,890 B1 | 7/2017 | Wang |
| 9,722,618 B1 | 8/2017 | Cheng |
| 9,729,159 B1 | 8/2017 | Cheng |
| 9,789,840 B2 | 10/2017 | Farooq |
| 9,804,856 B2 | 10/2017 | Oh et al. |
| 9,847,111 B2 | 12/2017 | Shu et al. |
| 9,853,633 B1 | 12/2017 | Cheng et al. |
| 9,853,634 B2 | 12/2017 | Chang |
| 9,859,902 B2 | 1/2018 | Chang |
| 9,916,889 B1 | 3/2018 | Duong |
| 9,935,635 B2 | 4/2018 | Kim et al. |
| 9,966,118 B2 | 5/2018 | Shu et al. |
| 10,065,594 B2 | 9/2018 | Fukawatase |
| 10,153,042 B2 | 12/2018 | Ehrman |
| 10,192,592 B2 | 1/2019 | Shu et al. |
| 10,249,312 B2 | 4/2019 | Kim et al. |
| 10,249,362 B2 | 4/2019 | Shu |
| 10,388,364 B2 | 8/2019 | Ishizu et al. |
| 10,425,070 B2 | 9/2019 | Chen et al. |
| 10,521,229 B2 | 12/2019 | Shu et al. |
| 10,535,381 B2 | 1/2020 | Shu et al. |
| 10,659,058 B1 | 5/2020 | Cheng et al. |
| 10,673,440 B1 | 6/2020 | Camarota |
| 10,770,133 B1 | 9/2020 | Haig et al. |
| 10,777,262 B1 | 9/2020 | Haig et al. |
| 2001/0052822 A1 | 12/2001 | Kim et al. |
| 2002/0006072 A1 | 1/2002 | Kunikiyo |
| 2002/0060938 A1 | 5/2002 | Song |
| 2002/0136074 A1 | 9/2002 | Hanzawa et al. |
| 2002/0154565 A1 | 10/2002 | Noh et al. |
| 2002/0168935 A1 | 11/2002 | Han |
| 2003/0016689 A1 | 1/2003 | Hoof |
| 2003/0107913 A1 | 6/2003 | Nii |
| 2003/0185329 A1 | 10/2003 | Dickmann |
| 2004/0053510 A1 | 3/2004 | Little |
| 2004/0062138 A1 | 4/2004 | Partsch et al. |
| 2004/0090413 A1 | 5/2004 | Yoo |
| 2004/0160250 A1 | 8/2004 | Kim et al. |
| 2004/0169565 A1 | 9/2004 | Gaggl et al. |
| 2004/0199803 A1 | 10/2004 | Suzuki et al. |
| 2004/0240301 A1 | 12/2004 | Rao |
| 2004/0264279 A1* | 12/2004 | Wordeman ........ G11C 11/40603 365/230.05 |
| 2004/0264286 A1 | 12/2004 | Ware et al. |
| 2005/0024912 A1 | 2/2005 | Chen et al. |
| 2005/0026329 A1 | 2/2005 | Kim et al. |
| 2005/0036394 A1 | 2/2005 | Shiraishi |
| 2005/0186930 A1 | 8/2005 | Rofougaran et al. |
| 2005/0226079 A1 | 10/2005 | Zhu et al. |
| 2005/0226357 A1 | 10/2005 | Yoshimura |
| 2005/0253658 A1 | 11/2005 | Maeda et al. |
| 2005/0285862 A1 | 12/2005 | Noda |

(56) References Cited

U.S. PATENT DOCUMENTS

| | | |
|---|---|---|
| 2006/0039227 A1 | 2/2006 | Lai et al. |
| 2006/0055434 A1 | 3/2006 | Tak et al. |
| 2006/0119443 A1 | 6/2006 | Azam et al. |
| 2006/0139105 A1 | 6/2006 | Maxim et al. |
| 2006/0143428 A1 | 6/2006 | Noda |
| 2006/0248305 A1 | 11/2006 | Fang |
| 2007/0001721 A1 | 1/2007 | Chen et al. |
| 2007/0047283 A1 | 3/2007 | Miyanishi |
| 2007/0058407 A1 | 3/2007 | Dosaka et al. |
| 2007/0109030 A1 | 5/2007 | Park |
| 2007/0115739 A1 | 5/2007 | Huang |
| 2007/0139997 A1 | 6/2007 | Suzuki |
| 2007/0171713 A1 | 7/2007 | Hunter |
| 2007/0189101 A1 | 8/2007 | Lambrache et al. |
| 2007/0229129 A1 | 10/2007 | Nakagawa |
| 2008/0010429 A1 | 1/2008 | Rao |
| 2008/0049484 A1 | 2/2008 | Sasaki |
| 2008/0068096 A1 | 3/2008 | Feng et al. |
| 2008/0079467 A1 | 4/2008 | Hou et al. |
| 2008/0080230 A1 | 4/2008 | Liaw |
| 2008/0117707 A1 | 5/2008 | Manickavasakam |
| 2008/0129402 A1 | 6/2008 | Han et al. |
| 2008/0155362 A1 | 6/2008 | Chang et al. |
| 2008/0175039 A1 | 7/2008 | Thomas |
| 2008/0181029 A1 | 7/2008 | Joshi et al. |
| 2008/0265957 A1 | 10/2008 | Luong et al. |
| 2008/0273361 A1 | 11/2008 | Dudeck et al. |
| 2009/0027947 A1 | 1/2009 | Takeda |
| 2009/0089646 A1 | 4/2009 | Hirose |
| 2009/0141566 A1 | 6/2009 | Arsovski |
| 2009/0154257 A1 | 6/2009 | Fukaishi et al. |
| 2009/0231943 A1 | 9/2009 | Kunce et al. |
| 2009/0256642 A1 | 10/2009 | Lesso |
| 2009/0296869 A1 | 12/2009 | Chao et al. |
| 2009/0319871 A1 | 12/2009 | Shirai et al. |
| 2010/0085086 A1 | 4/2010 | Nedovic et al. |
| 2010/0157715 A1 | 6/2010 | Pyeon |
| 2010/0169675 A1 | 7/2010 | Kajihara |
| 2010/0172190 A1 | 7/2010 | Lavi |
| 2010/0177571 A1 | 7/2010 | Shori et al. |
| 2010/0214815 A1 | 8/2010 | Tam |
| 2010/0232202 A1 | 9/2010 | Lu |
| 2010/0260001 A1 | 10/2010 | Kasprak et al. |
| 2010/0271138 A1 | 10/2010 | Thakur et al. |
| 2010/0322022 A1 | 12/2010 | Shinozaki et al. |
| 2011/0018597 A1 | 1/2011 | Lee et al. |
| 2011/0063898 A1 | 3/2011 | Ong |
| 2011/0153932 A1 | 6/2011 | Ware et al. |
| 2011/0211401 A1 | 9/2011 | Chan et al. |
| 2011/0267914 A1 | 11/2011 | Ishikura et al. |
| 2011/0280307 A1 | 11/2011 | Macinnis et al. |
| 2011/0292743 A1 | 12/2011 | Zimmerman |
| 2011/0299353 A1 | 12/2011 | Ito et al. |
| 2012/0049911 A1 | 3/2012 | Ura |
| 2012/0133114 A1 | 5/2012 | Choi |
| 2012/0153999 A1 | 6/2012 | Kim |
| 2012/0242382 A1 | 9/2012 | Tsuchiya et al. |
| 2012/0243347 A1 | 9/2012 | Sampigethaya |
| 2012/0250440 A1 | 10/2012 | Wu |
| 2012/0281459 A1 | 11/2012 | Teman et al. |
| 2012/0327704 A1 | 12/2012 | Chan |
| 2013/0039131 A1 | 2/2013 | Haig et al. |
| 2013/0083591 A1 | 4/2013 | Wuu |
| 2013/0170289 A1 | 7/2013 | Grover et al. |
| 2014/0056093 A1 | 2/2014 | Tran et al. |
| 2014/0125390 A1 | 5/2014 | Ma |
| 2014/0136778 A1 | 5/2014 | Khailany et al. |
| 2014/0185366 A1 | 7/2014 | Chandwani et al. |
| 2014/0269019 A1 | 9/2014 | Kolar |
| 2015/0003148 A1 | 1/2015 | Iyer et al. |
| 2015/0029782 A1 | 1/2015 | Jung |
| 2015/0063052 A1 | 3/2015 | Manning |
| 2015/0187763 A1 | 7/2015 | Kim et al. |
| 2015/0213858 A1 | 7/2015 | Tao |
| 2015/0248927 A1 | 9/2015 | Fujiwara |
| 2015/0279453 A1 | 10/2015 | Fujiwara |
| 2015/0302917 A1 | 10/2015 | Grover |
| 2015/0310901 A1 | 10/2015 | Jung |
| 2015/0357028 A1 | 12/2015 | Huang et al. |
| 2016/0005458 A1 | 1/2016 | Shu et al. |
| 2016/0027500 A1 | 1/2016 | Chuang et al. |
| 2016/0064068 A1 | 3/2016 | Mojumder |
| 2016/0141023 A1 | 5/2016 | Jung |
| 2016/0225436 A1 | 8/2016 | Wang |
| 2016/0225437 A1* | 8/2016 | Kumar .................. G11C 11/419 |
| 2016/0247559 A1 | 8/2016 | Atallah et al. |
| 2016/0284392 A1 | 9/2016 | Block et al. |
| 2016/0329092 A1 | 11/2016 | Akerib |
| 2017/0194046 A1 | 7/2017 | Yeung, Jr. et al. |
| 2017/0345505 A1 | 11/2017 | Noel et al. |
| 2018/0122456 A1 | 5/2018 | Li |
| 2018/0123603 A1 | 5/2018 | Chang |
| 2018/0157621 A1 | 6/2018 | Shu et al. |
| 2018/0158517 A1 | 6/2018 | Shu et al. |
| 2018/0158518 A1 | 6/2018 | Shu et al. |
| 2018/0158519 A1 | 6/2018 | Shu et al. |
| 2018/0158520 A1 | 6/2018 | Shu |
| 2020/0117398 A1 | 4/2020 | Haig et al. |
| 2020/0160905 A1 | 5/2020 | Charles et al. |
| 2020/0301707 A1 | 9/2020 | Shu et al. |

* cited by examiner

READ AND WRITE DATA PROCESSING CIRCUITS AND METHODS ASSOCIATED WITH COMPUTATIONAL MEMORY CELLS USING TWO READ MULTIPLEXERS

PRIORITY CLAIM/RELATED APPLICATIONS

This application is a continuation in part of and claims priority under 35 USC 120 to U.S. patent application Ser. No. 15/709,399, filed Sep. 19, 2017 and entitled "Computational Dual Port Sram Cell And Processing Array Device Using The Dual Port Sram Cells For Xor And Xnor Computations", U.S. patent application Ser. No. 15/709,401, filed Sep. 19, 2017 and entitled "Computational Dual Port Sram Cell And Processing Array Device Using The Dual Port Sram Cells For Xor And Xnor Computations", U.S. patent application Ser. No. 15/709,379, filed Sep. 19, 2017 and entitled "Computational Dual Port Sram Cell And Processing Array Device Using The Dual Port Sram Cells", U.S. patent application Ser. No. 15/709,382, filed Sep. 19, 2017 and entitled "Computational Dual Port Sram Cell And Processing Array Device Using The Dual Port Sram Cells", and U.S. patent application Ser. No. 15/709,385, filed Sep. 19, 2017 and entitled "Computational Dual Port Sram Cell And Processing Array Device Using The Dual Port Sram Cells" that in turn claim priority under 35 USC 119(e) and 120 and claim the benefit of U.S. Provisional Patent Application No. 62/430,767, filed Dec. 6, 2016 and entitled "Computational Dual Port Sram Cell And Processing Array Device Using The Dual Port Sram Cells For Xor And Xnor Computations" and U.S. Provisional Patent Application No. 62/430,762, filed Dec. 6, 2016 and entitled "Computational Dual Port Sram Cell And Processing Array Device Using The Dual Port Sram Cells", the entirety of all of which are incorporated herein by reference.

FIELD

The disclosure relates generally to a computational memory element and in particular to a computational memory element array having read multiplexers to increase the computation speed of the computational memory element array.

BACKGROUND

Memory cells have traditionally been used to store bits of data. It is also possible to architect a memory cell so that the memory cell is able to perform some simple logical functions when multiple memory cells are connected to the same read bit line. For example, when memory cells A, B, and C are connected to a particular read bit line and are read simultaneously, and the memory cells and read bit line circuitry are designed to produce a logical AND result, then the result that appears on the read bit line is AND (a,b,c) (i.e. "a AND b AND c"), where a, b, and c represent the binary data values stored in memory cells A, B, and C respectively.

By themselves, these computational memory cells and read bit line circuitry allow for a single logical function (e.g. AND) to be performed across multiple memory cells connected to the same read bit line, when read simultaneously. A read processing circuit and a write data processing circuit are also provided that process the read data and write data for these computational memory cells. These circuits however are entirely independent of one another so that, if implemented in this manner, then if the write data is to be used in a later computation in the bit line section, it must first be stored in one of the bit line section's computational memory cells. Afterwards, it may then be read and logically combined in some manner with other data in the bit line section to perform a logical operation, via the read bit line logical functionality (e.g. AND), and/or via the read accumulation logical functionality (e.g. OR). However, computational performance can be improved by routing the selected write data directly into the read logic of the bit line section, so that it can be used for computational purposes immediately, rather than first having to store it in one of the bit line section's memory cells before it is used for computational purposes and it is to this end that the disclosure is directed.

DETAILED DESCRIPTION OF ONE OR MORE EMBODIMENTS

The disclosure is particularly applicable to a processing array, semiconductor memory or computer that utilizes a plurality of computational memory cells (with each cell being formed with a static random access memory (SRAM) cell) and additional read logic circuitry to provide more complex logical functions and faster computation performance based on the data read out of the computational memory cells and it is in this context that the disclosure will be described. It will be appreciated, however, that each memory cell may be other types of volatile and non-volatile memory cell that are within the scope of the disclosure, that other additional read circuitry (including more, less or different logic) may be used are within the scope of the disclosure or that different computational memory cell architectures that those disclosed below are within the scope of the disclosure.

The disclosure is directed to a memory/processing array that has a plurality of computing memory cells in an array with additional read data processing logic circuitry. Each computing memory cell in a column in the array may have a read bit line and the read bit line for each of the computing memory cells in the column may be tied together as a single read bit line. The memory/processing array may be subdivided into one or more sections (an example of which is shown in FIGS. 3B and 3C) wherein each section has a unique set of "n" bit lines (each bit line being part of a bit line section) where each bit line section comprises a single read bit line and a pair of positive and negative write bit lines, with each bit line connected to "m" computational memory cells. Each bit line section also may have a read data storage that is used to capture and store the read result from the read bit line during read operations (so a read data storage is implemented per read bit line) and read circuitry for routing the read data or the selected write data for performing logical operations. In the disclosure, BL-Sect[x, y] is a shorthand notation indicating a bit line section with bit line "y" in section "x" and "bl-sect" means bit line section.

The read logic or read processing circuitry may be used with the memory/processing array with each bit line section above to more efficiently route selected write data to the read logic in the processing array since it is desirable to be able to perform the computations in the processing array more efficiently and with greater performance.

Figure 1:
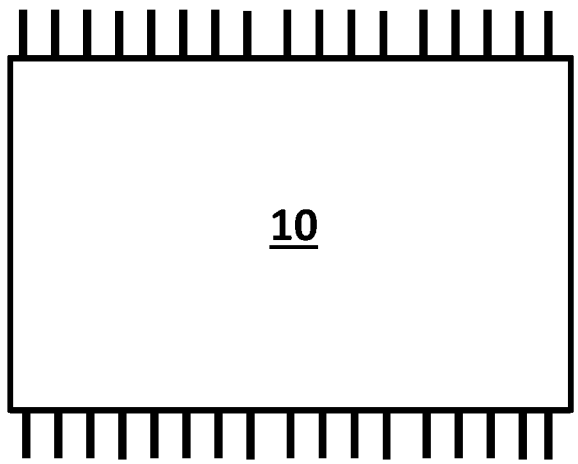
FIG. 1 illustrates an example of a semiconductor memory that may include a plurality of computation memory cells and read and write data selection circuitry.
Figure 2:
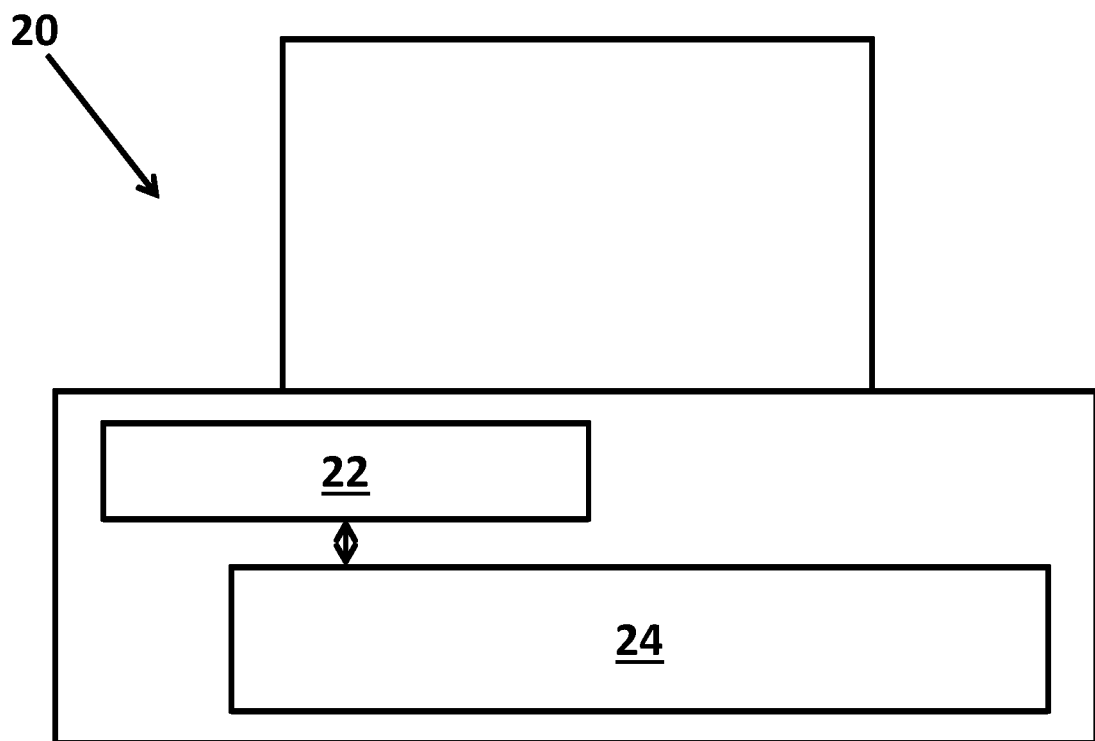
FIG. 2 illustrates an example of a computer system that may include a plurality of computation memory cells and read and write data selection circuitry.

FIG. 1 illustrates an example of a semiconductor memory 10 that may include a plurality of computation memory cells and read logic for selecting read or write data that are described below in more detail. The below disclosed plurality of computation memory cells and read circuitry for selecting read or write data allow the semiconductor memory 10 to perform more complex logic functions quicker than are possible with just the plurality of computation memory cells. FIG. 2 illustrates an example of a computer system 20 that may include a plurality of computation memory cells and read circuitry for selecting read or write data that are described below in more detail. The below disclosed plurality of computation memory cells and read circuitry for selecting read or write data similarly allow computer system 20 and memory 24 to perform more complex logic functions quicker than are possible with just the plurality of computation memory cells. The computer system 20 may have at least one processor 22 and a memory 24 that may include the plurality of computation memory cells and read circuitry for selecting read or write data.

Figure 3A:
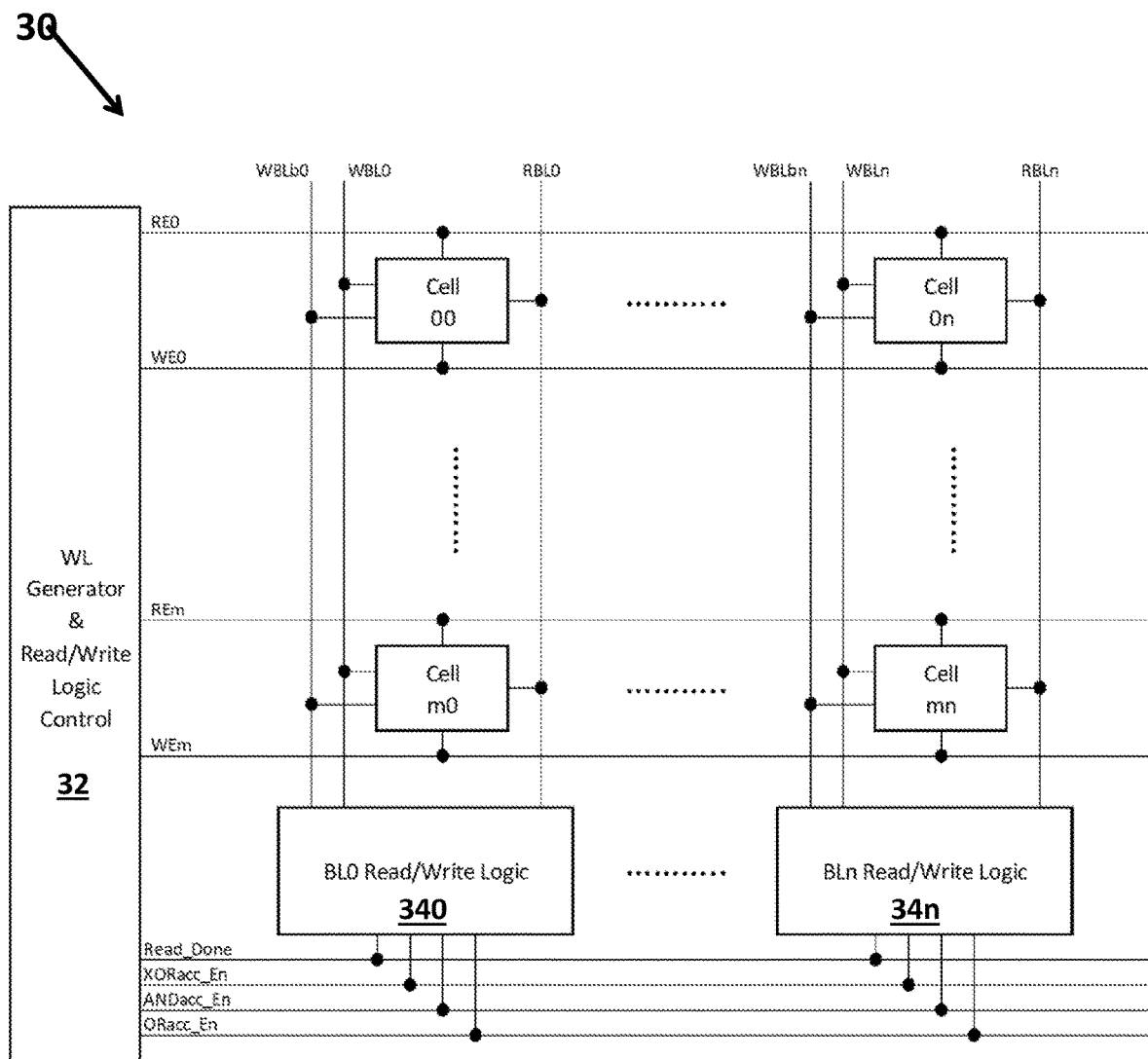
FIG. 3A illustrates an example of a processing array with computational memory cells that may be incorporated into a semiconductor memory or computer system.
Figure 3B:
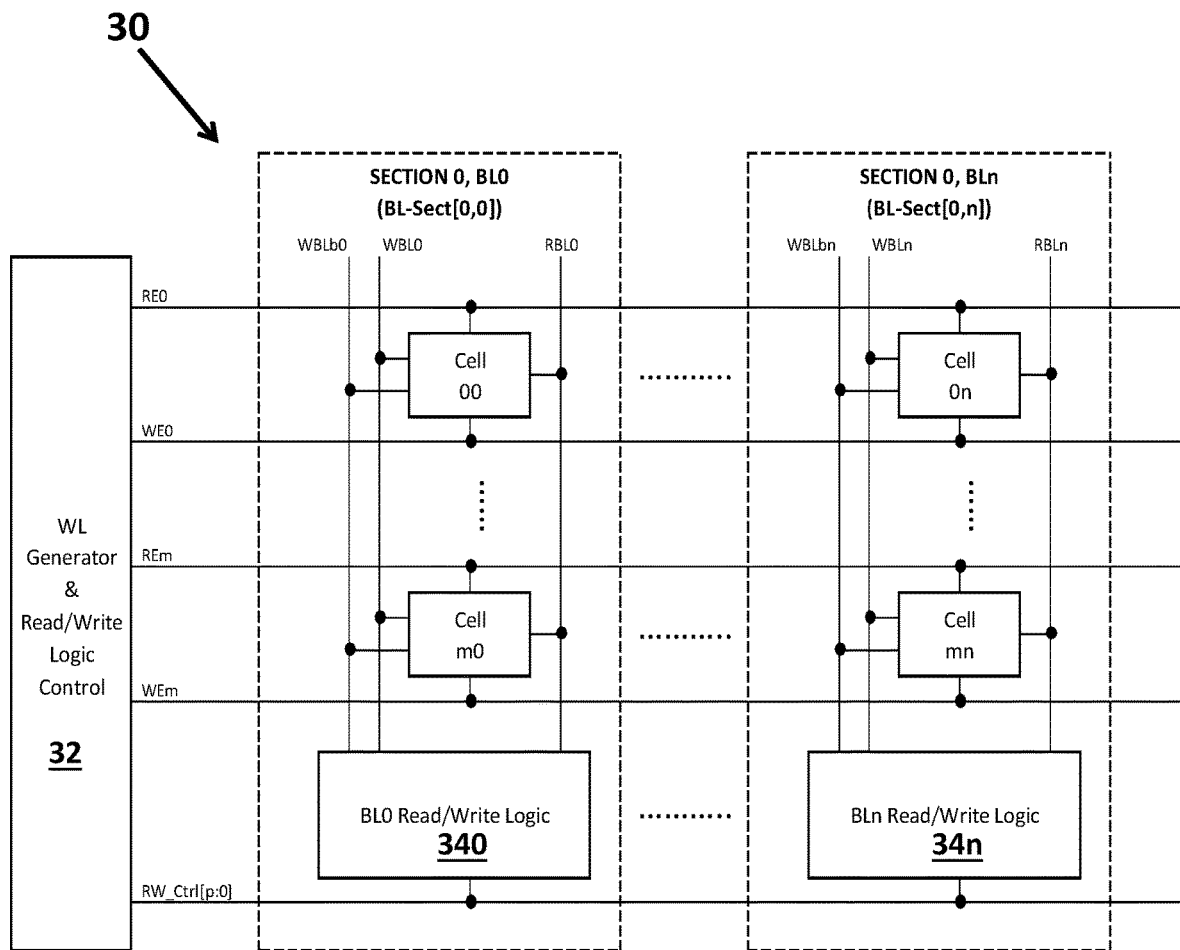
FIG. 3B illustrates the processing array with computational memory cells having one section and multiple bit line sections.
Figure 3C:
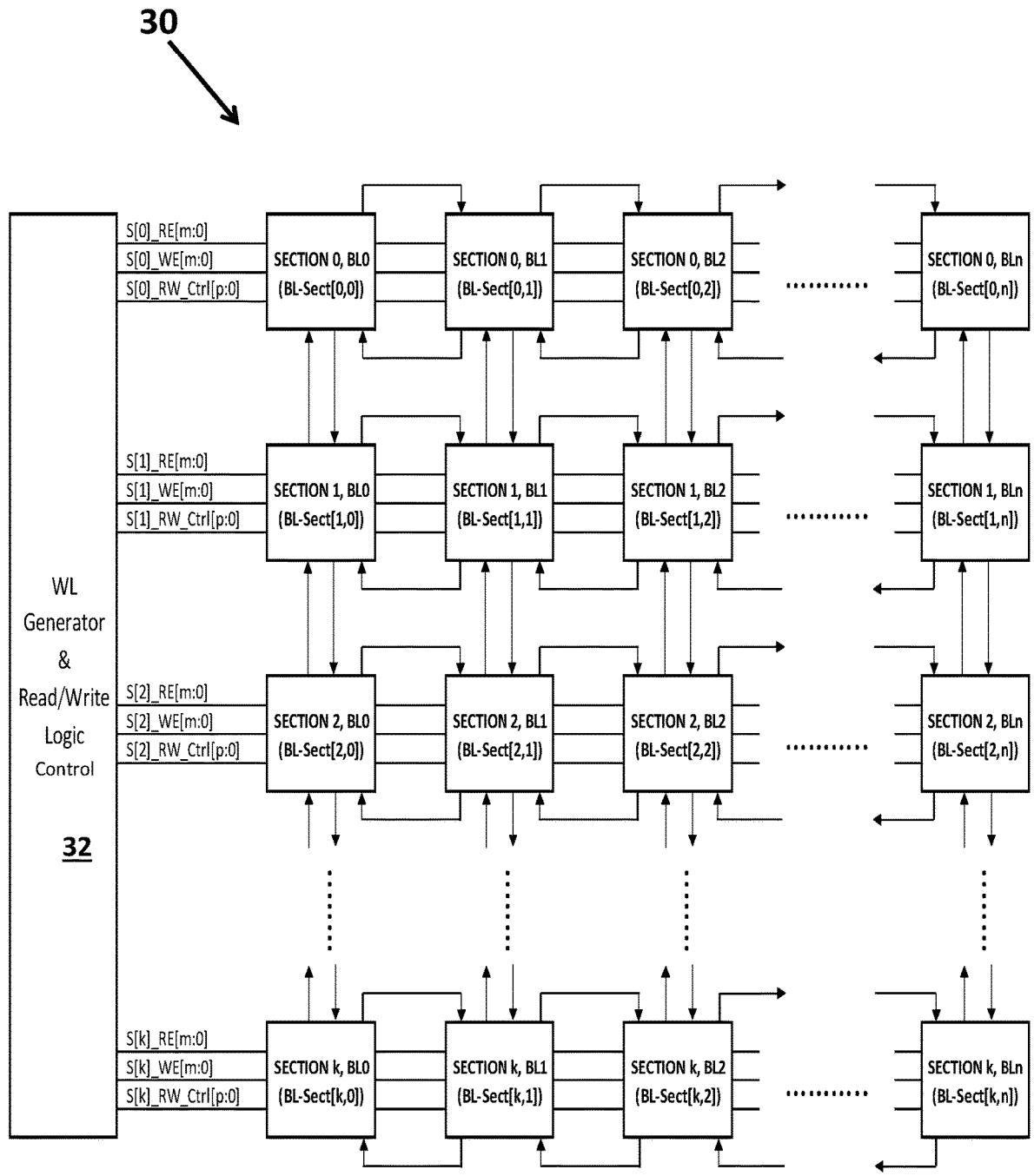
FIG. 3C illustrates the processing array with computational memory cells having multiple sections and multiple bit line sections.

FIG. 3A illustrates an example of a processing array 30 with computational memory cells in an array that may be incorporated into a semiconductor memory or computer system. The processing array 30 may include an array of computational memory cells (cell 00, . . . , cell 0n and cell m0, . . . , cell mn). In one embodiment, the array of computational memory cells may be rectangular as shown in FIG. 3A and may have a plurality of columns and a plurality of rows wherein the computational memory cells in a particular column may also be connected to the same read bit line (RBL0, . . . , RBLn). The processing array 30 may further include a wordline (WL) generator and read/write logic control circuit 32 that may be connected to and generate signals for the read word line (RE) and write word line (WE) for each memory cell (such as RE0, . . . , REn and WE0, . . . , WEn) to control the read and write operations is well known and one or more read/write circuitry 34 that are connected to the read and write bit lines of the computational memory cells. In the embodiment shown in FIG. 3A, the processing array may have read/write circuitry 34 for each set of bit line signals of the computational memory cells (e.g., for each column of the computational memory cells whose read bit lines are connected to each other). For example, BL0 read/write logic 340 may be coupled to the read and write bit lines (WBLb0, WBL0 and RBL0) for the computational memory cells in column 0 of the array and BLn read/write logic 34n may be coupled to the read and write bit lines (WBLbn, WBLn and RBLn) for the computational memory cells in column n of the array as shown in FIG. 3A.

The wordline (WL) generator and read/write logic control circuit 32 may also generate one or more control signals that control each read/write circuitry 34. For example, for the different embodiments of the read/write logic described in the co-pending U.S. patent application Ser. No. 16/111,178, filed on Aug. 23, 2018 and incorporated herein by reference, the one or more control signals may be RW_Ctrl[p:0] as shown in FIGS. 3B & 3C. Note that for each different embodiment, a different one or more of the control signals is used so that the wordline (WL) generator and read/write logic control circuit 32 may generate different control signals for each embodiment or the wordline (WL) generator and read/write logic control circuit 32 may generate each of the control signals, but then only certain of the control signals or all of the control signals may be utilized as described in the above incorporated by reference co-pending patent application.

During a read operation, the wordline (WL) generator and read/write logic control circuit 32 may activate one or more word lines that activate one or more computational memory cells so that the read bit lines of those one or more computational memory cells may be read out. Further details of the read operation are not provided here since the read operation is well known.

FIGS. 3B and 3C illustrate the processing array 30 with computational memory cells having sections having the same elements as shown in FIG. 3A. The array 30 in FIG. 3B has one section (Section 0) with "n" bit lines (bit line 0 (BL0), . . . , bit line n (BLn)) in different bit line sections, where each bit line connects to "m" computational memory cells (cell 00, . . . , cell m0 for bit line 0, for example). In the example in FIG. 3B, the m cells may be the plurality of computational memory cells that are part of each column of the array 30. FIG. 3C illustrates the processing array 30 with computational memory cells having multiple sections. In the example in FIG. 3C, the processing array device 30 comprises "k" sections with "n" bit lines each, where each bit line within each section connects to "m" computational memory cells. Note that the other elements of the processing array 30 are present in FIG. 3C, but not shown for clarity. As shown in FIG. 3C, there may also be read data storage output paths between horizontally and vertically adjacent bit line sections. In FIG. 3C, the BL-Sect(0,0) block shown corresponds to the BL-Sect(0,0) shown in FIG. 3B with the plurality of computational memory cells and the read/write logic 340 and each other block shown in FIG. 3C corresponds to a separate portion of the processing array. As shown in FIG. 3C, the set of control signals, generated by the wordline generator and read/write logic controller 32, for each section may include one or more read enable control signals (for example S[0]_RE[m:0] for section 0), one or more write enable control signals (for example S[0]_WE [m:0] for section 0) and one or more read/write control signals (for example S[0]_RW_Ctrl[p:0] for section 0). As shown in FIG. 3C, the array 30 may have a plurality of sections (0, . . . , k in the example in FIG. 3C) and each section may have multiple bit line sections.

Figure 4A:
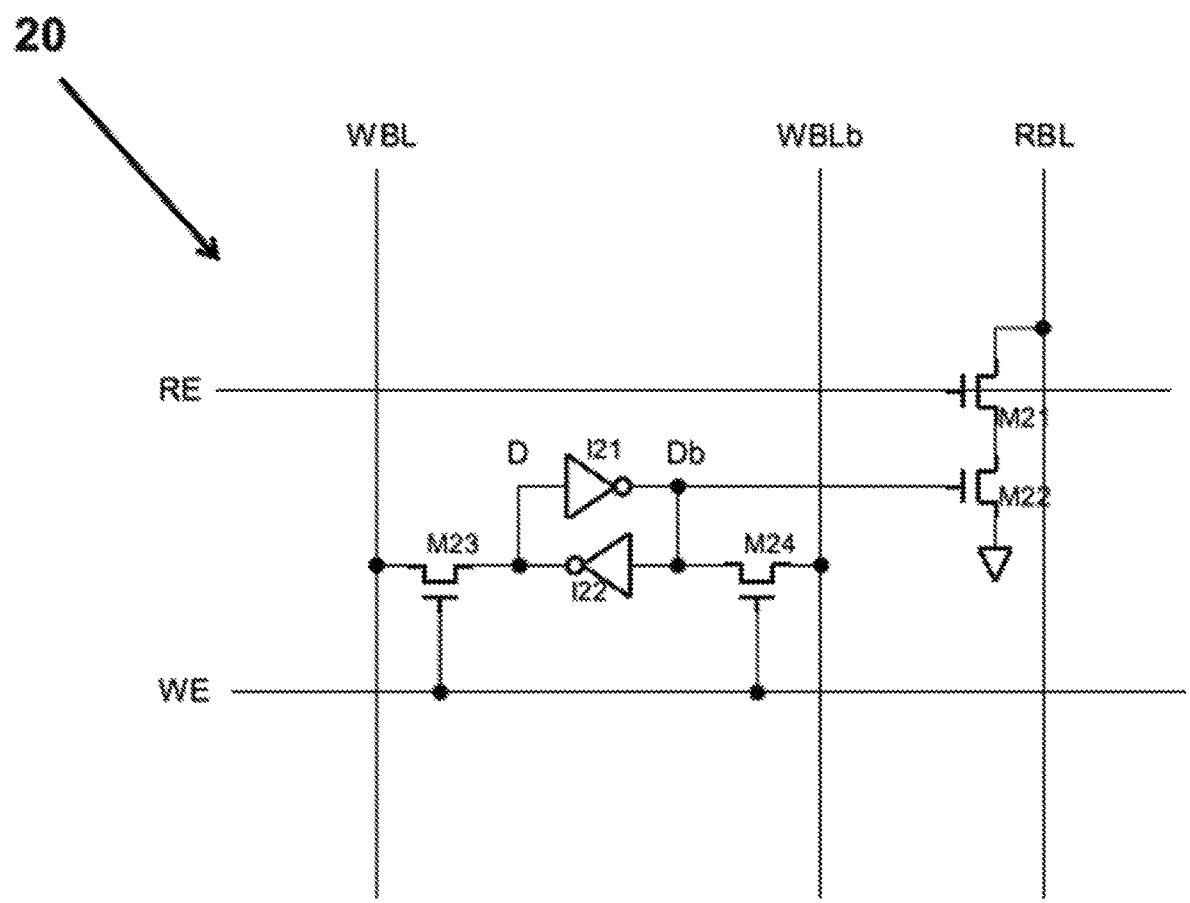
FIGS. 4A and 4B illustrate examples of two different types of computational memory cells that may be used in the semiconductor memory of FIG. 1, the computer system of FIG. 2 or the processing array of FIGS. 3A-3C.
Figure 4B:
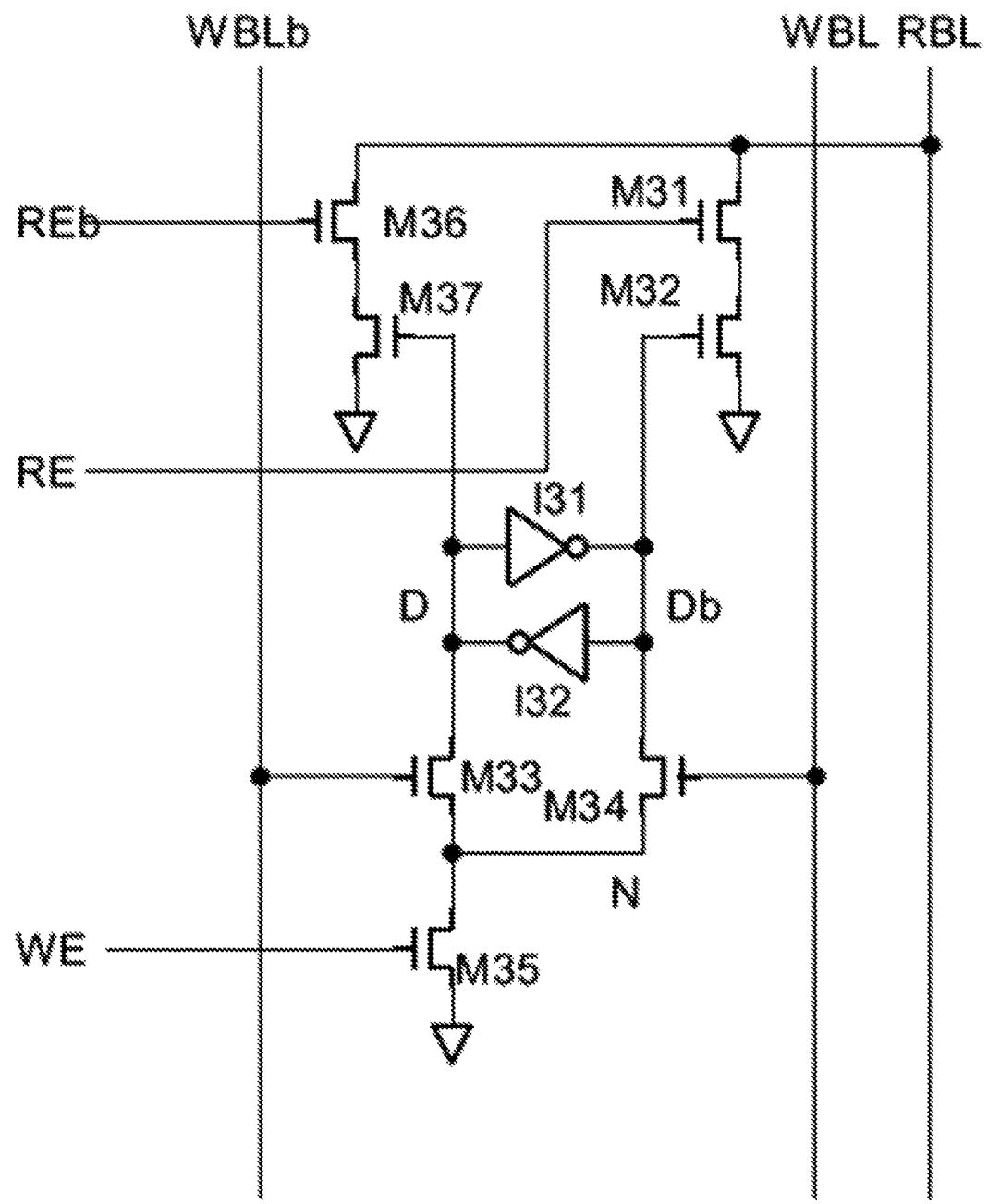

FIGS. 4A and 4B illustrate examples of two different types of computational memory cells that may be used in the semiconductor memory of FIG. 1, the computer system of FIG. 2 or the processing array of FIGS. 3A-C. In the examples, the computational memory cell are based on an SRAM memory cell.

FIG. 4A illustrates an example of a dual port SRAM cell 20 that may be used for computation. The dual port SRAM cell may include two cross coupled inverters 121, 122 and two access transistors M23 and M24 that interconnected together to form a 6T SRAM cell. The SRAM may be operated as storage latch and may have a write port. The two inverters are cross coupled since the input of the first inverter is connected to the output of the second inverter and the output of the first inverter is coupled to the input of the second inverter as shown in FIG. 4A. A Write Word line carries a signal and is called WE and a write bit line and its complement are called WBL and WBLb, respectively. The Write word line WE is coupled to the gates of the two access transistors M23, M24 that are part of the SRAM cell. The write bit line and its complement (WBL and WBLb) are each coupled to one side of the respective access transistors M23, M24 as shown in FIG. 4A while the other side of each of those access transistors M23, M24 are coupled to each side of the cross coupled inverters (labeled D and Db in FIG. 4A.)

The circuit in FIG. 4A may also have a read word line RE, a read bit line RBL and a read port formed by transistors M21, M22 coupled together to form as isolation circuit as shown. The read word line RE may be coupled to the gate of transistor M21 that forms part of the read port while the read bit line is coupled to the source terminal of transistor M21. The gate of transistor M22 may be coupled to the Db output from the cross coupled inverters 121, 122.

During reading, multiple cells (with only a single cell being shown in FIG. 4A) can turn on to perform an AND function. Specifically, at the beginning of the read cycle, RBL is pre-charged high and if the Db signal of all cells that are turned on by RE is "0", then RBL stays high since, although the gate of transistor M21 is turned on by the RE signal, the gate of M22 is not turned on and the RBL line is not connected to the ground to which the drain of transistor M22 is connected. If the Db signal of any or all of the cells is "1" then RBL is discharged to 0 since the gate of M22 is turned on and the RBL line is connected to ground. As a result, RBL=NOR (Db0, Db1, etc.) where Db0, Db1, etc. are the complementary data of the SRAM cells that have been turned on by the RE signal. Alternatively, RBL=NOR (Db0, Db1, etc.)=AND (D0, D1, etc.), where D0, D1, etc. are the true data of the cells that have been turned on by the RE signal.

As shown in FIG. 4A, the Db signal of the cell 20 may be coupled to a gate of transistor M22 to drive the RBL. However, unlike the typical 6T cell, the Db signal is isolated from the RBL line and its signal/voltage level by the transistors M21, M22. Because the Db signal/value is isolated from the RBL line and signal/voltage level, the Db signal is not susceptive to the lower bit line level caused by multiple "0" data stored in multiple cells in contrast to the typical SRAM cell. Therefore, for the cell in FIG. 4A, there is no limitation of how many cells can be turned on to drive RBL. As a result, the cell (and the device made up for multiple cells) offers more operands for the AND function since there is no limit of how many cells can be turned on to drive RBL. Furthermore, in the cell in FIG. 4A, the RBL line is pre-charged (not a static pull up transistor as with the typical 6T cell) so this cell can provide much faster sensing because the current generated by the cell is all be used to discharge the bit line capacitance with no current being consumed by a static pull up transistor so that the bit line discharging rate can be faster by more than 2 times. The sensing for the disclosed cell is also lower power without the extra current consumed by a static pull up transistor and the discharging current is reduced by more than half.

The write port of the cell in FIG. 4A is operated in the same manner as the 6T typical SRAM cell. As a result, the write cycle and Selective Write cycle for the cell have the same limitation as the typical 6T cell. In addition to the AND function described above, the SRAM cell 20 in FIG. 4A also may perform a NOR function by storing inverted data. Specifically, if D is stored at the gate of M22, instead of Db, then RBL=NOR (D0, D1, etc.). One skilled in the art understand that the cell configuration shown in FIG. 4A would be slightly altered to achieve this, but that modification is within the scope of the disclosure. Further details of this exemplary computational memory cell is found in co-pending U.S. patent application Ser. Nos. 15/709,379, 15/709,382 and 15/709,385 all filed on Sep. 19, 2017 and entitled "Computational Dual Port Sram Cell And Processing Array Device Using The Dual Port Sram Cells" which are incorporated herein by reference.

FIG. 4B illustrates an implementation of a dual port SRAM cell 100 with an XOR function. The dual port SRAM cell 100 may include two cross coupled inverters 131, 132 and two access transistors M33 and M34 that are interconnected together as shown in FIG. 4B to form the basic SRAM cell. The SRAM may be operated as storage latch and may have a write port. The two inverters 131, 132 are cross coupled since the input of the first inverter is connected to the output of the second inverter (labeled D) and the output of the first inverter (labeled Db) is coupled to the input of the second inverter as shown in FIG. 4B. The cross coupled inverters 131, 132 form the latch of the SRAM cell. The access transistor M33 and M34 may have their respective gates connected to write bit line and its complement (WBL, WBLb) respectively. A Write Word line carries a signal WE. The Write word line WE is coupled to the gate of a transistor M35 that is part of the access circuitry for the SRAM cell.

The circuit in FIG. 4B may also have a read word line RE, a read bit line RBL and a read port formed by transistors M31, M32 coupled together to form as isolation circuit as shown. The read word line RE may be coupled to the gate of transistor M31 that forms part of the read port while the read bit line RBL is coupled to the drain terminal of transistor M31. The gate of transistor M32 may be coupled to the Db output from the cross coupled inverters 131, 132. The isolation circuit isolates the latch output Db (in the example in FIG. 4B) from the read bit line and signal/voltage level so that the Db signal is not susceptive to the lower bit line level caused by multiple "0" data stored in multiple cells in contrast to the typical SRAM cell.

The cell 100 may further include two more read word line transistors M36, M37 and one extra complementary read word line, REb. When the read port is active, either RE or REb is high and the REb signal/voltage level is the complement of RE signal/voltage level. RBL is pre-charged high, and if one of (M31, M32) or (M36, M37) series transistors is on, RBL is discharged to 0. If none of (M31, M32) or (M36, M37) series transistors is on, then RBL stay high as 1 since it was precharged high. The following equation below, where D is the data stored in the cell and Db is the complement data stored in the cell, describes the functioning/operation of the cell:

$$RBL=AND(NAND(RE,Db),NAND(REb,D))= XNOR(RE,D) \quad (EQ1)$$

If the word size is 8, then it needs to be stored in 8 cells (with one cell being shown in FIG. 4B) on the same bit line. On a search operation, an 8 bit search key can be entered using the RE, REb lines of eight cells to compare the search key with cell data. If the search key bit is 1, then the corresponding RE=1 and REb=0 for that cell. If the search key bit is 0, then the corresponding RE=0 and REb=1. If all 8 bits match the search key, then RBL will be equal to 1. IF any 1 of the 8 bits is not matched, then RBL will be discharged and be 0. Therefore, this cell 100 (when used with 7 other cells for an 8 bit search key) can perform the same XNOR function but uses half the number of cell as the typical SRAM cell. The following equation for the multiple bits on the bit line may describe the operation of the cells as:

$$RBL=AND(XNOR(RE1,D1),XNOR(RE2,D2),\ldots, XNOR(REi,Di)), \text{ where } i \text{ is the number of active cell.} \quad (EQ2)$$

By controlling either RE or REb to be a high signal/on, the circuit 100 may also be used to do logic operations mixing true and complement data as shown below:

$$RBL=AND(D1,D2,\ldots,Dn,Dbn+1,Dbn+2,\ldots Dbm) \quad (EQ3)$$

where D1, D2, . . . Dn are "n" number of data with RE on and Dbn+1, Dbn+2, . . . Dbm are m-n number of data with REb on.

Furthermore, if the cell 100 stores inverse data, meaning WBL and WBLb shown in FIG. 4B is swapped, then the logic equation EQ1 becomes XOR function and logic equation EQ3 becomes NOR a function and can be expressed as EQ 4 and EQ5

$$RBL=XOR(RE,D) \quad (EQ4)$$

$$RBL=NOR(D1,D2,\ldots,Dn,Dbn+1,Dbn+2,\ldots Dbm) \quad (EQ5)$$

where D1, D2, . . . Dn are n number of data with RE on and Dbn+1, Dbn+2, . . . Dbm are m-n number of data with REb on.

In another embodiment, the read port of the circuit 100 is FIG. 4B may be reconfigured differently to achieve different Boolean equation. Specifically, transistors M31, M32, M36 and M37 may be changed to PMOS and the source of M32 and M37 is VDD instead of VSS, the bit line is pre-charged to 0 instead of 1 and the word line RE active state is 0. In this embodiment, the logic equations EQ1 is inverted so that RBL is an XOR function of RE and D (EQ6). EQ3 is rewritten as an OR function (EQ7) as follows:

$$RBL=XOR(RE,D) \quad (EQ6)$$

$$RBL=OR(D1,D2,\ldots,Dn,Dbn+1,Dbn+2,\ldots Dbm) \quad (EQ7)$$

where D1, D2, . . . Dn are n number of data with RE on and Dbn+1, Dbn+2, . . . Dbm are m-n number of data with REb on.

If the cell stores the inverse data of the above discussed PMOS read port, meaning WBL and WBLb is swapped, then $$RBL=XNOR(RE,D) \quad (EQ8)$$

$$RBL=NAND(D1,D2,\ldots,Dn,Dbn+1,Dbn+2,\ldots Dbm) \quad (EQ9)$$

where D1, D2, . . . Dn are n number of data with RE on and Dbn+1, Dbn+2, . . . Dbm are m-n number of data with REb on.

For example, consider a search operation where a digital word needs to be found in a memory array in which the memory array can be configured as each bit of the word stored on the same bit line. To compare 1 bit of the word, then the data is stored in a cell and its RE is the search key Key, then EQ1 can be written as below:

$$RBL=XNOR(Key,D) \quad EQ10$$

If Key=D, then RBL=1. If the word size is 8 bits as D[0:7], then the search key Key[0:7] is its RE, then EQ2 can be expressed as search result and be written as below:

$$RBL=AND(XNOR(Key[0],D[0]),XNOR(Key[1],D[1]),\ldots,Key[7],D[7]) \quad EQ11$$

If all Key[i] is equal to D[i] where i=0-7, then the search result RBL is match. Any one of Key[i] is not equal to D[i], then the search result is not match. Parallel search can be performed in 1 operation by arranging multiple data words along the same word line and on parallel bit lines with each word on 1 bit line. Further details of this computation memory cell may be found in U.S. patent application Ser. Nos. 15/709,399 and 15/709,401 both filed on Sep. 19, 2017 and entitled "Computational Dual Port Sram Cell And Processing Array Device Using The Dual Port Sram Cells For Xor And Xnor Computations", which are incorporated herein by reference.

Figure 5:
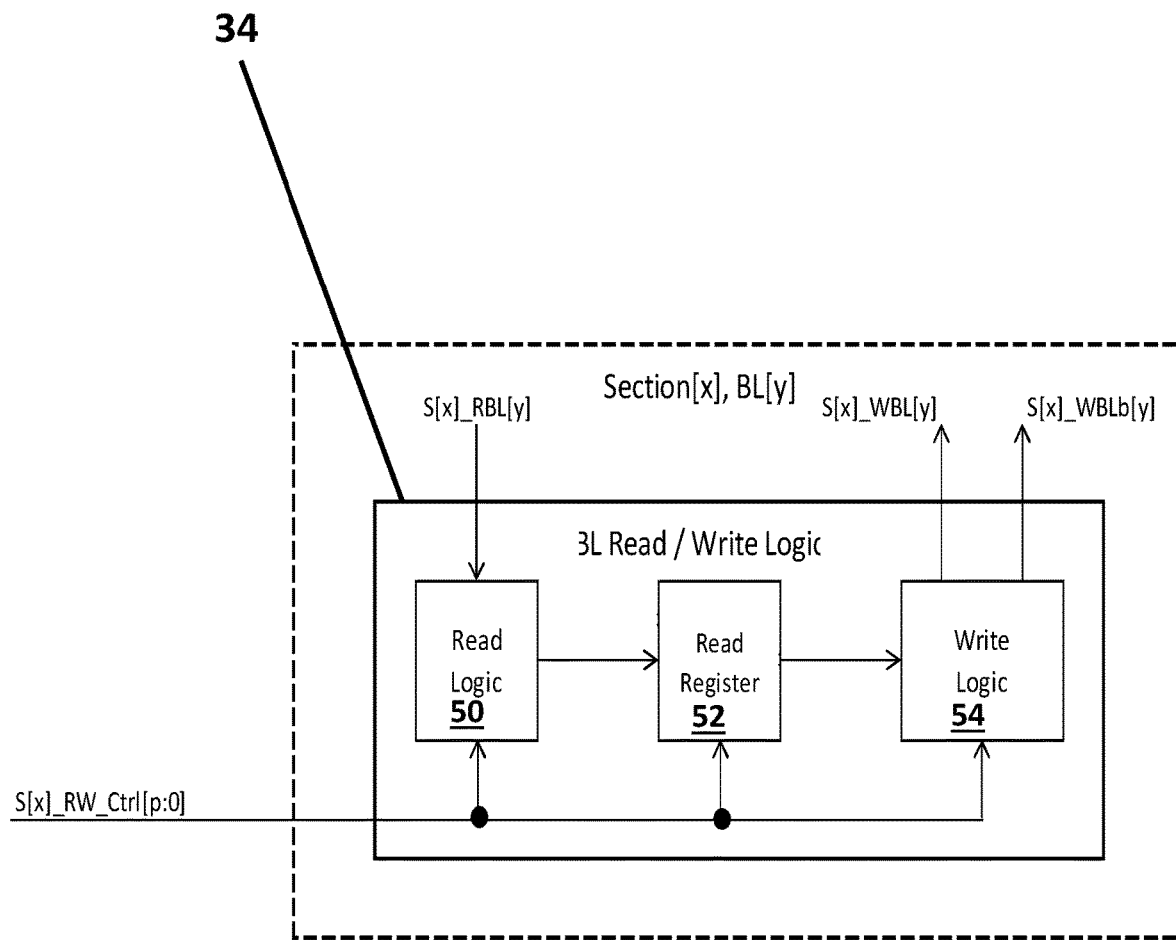
FIG. 5 illustrates read/write logic including read logic, read data storage, and write logic associated with each bit line section in the processing array device depicted in FIG. 3C.

FIG. 5 illustrates more details of the read/write circuitry 34 including read logic, read data storage, and write logic for each bl-sect in the processing array device depicted in FIG. 3C. The read/write circuitry 34 for each bit line section may include read circuitry 50, a read storage 52, implemented as a register, and write circuitry 54. The read circuitry 50 and read storage 52 allows the data on the read bit lines connected to the particular read circuitry and read storage to accumulate so that more complex Boolean logic operations may be performed. Various implementations of the read circuitry 50 and read storage 52 may be found in Ser. No. 16/111,178, filed Aug. 23, 2018 that is co-pending and co-owned and is incorporated herein by reference. The write circuitry 54 manages the writing of data in each bit line section. Each of the read circuitry 50, read storage 52 and write circuitry 54 may be connected to one or more control signals (S[x]_RW_Ctrl[p:0] in the example implementation shown in FIG. 5) that control the operation of each of the circuits. The control signals may include the read control signals that are described above in the incorporated by reference patent application.

The read circuitry 50 may receive inputs from the read bit lines of the computing memory cells of the section (S[x]_RBL[y]) and the write circuitry 54 may receive an input from the read data storage 52 and output data to the word bit lines of the computing memory cells of the section (S[x]_WBL[y] and S[x]_WBLb[y] in the example in FIG. 5). Thus, as shown in FIG. 5, the read storage 52 output is only connected to the write circuitry 54 associated with its own bl-sect. Consequently, the write circuitry 54 associated with each bl-sect receives the read data storage output only from its own bl-sect, and therefore each bl-sect can only store/write data from its own read data storage.

Figure 6:
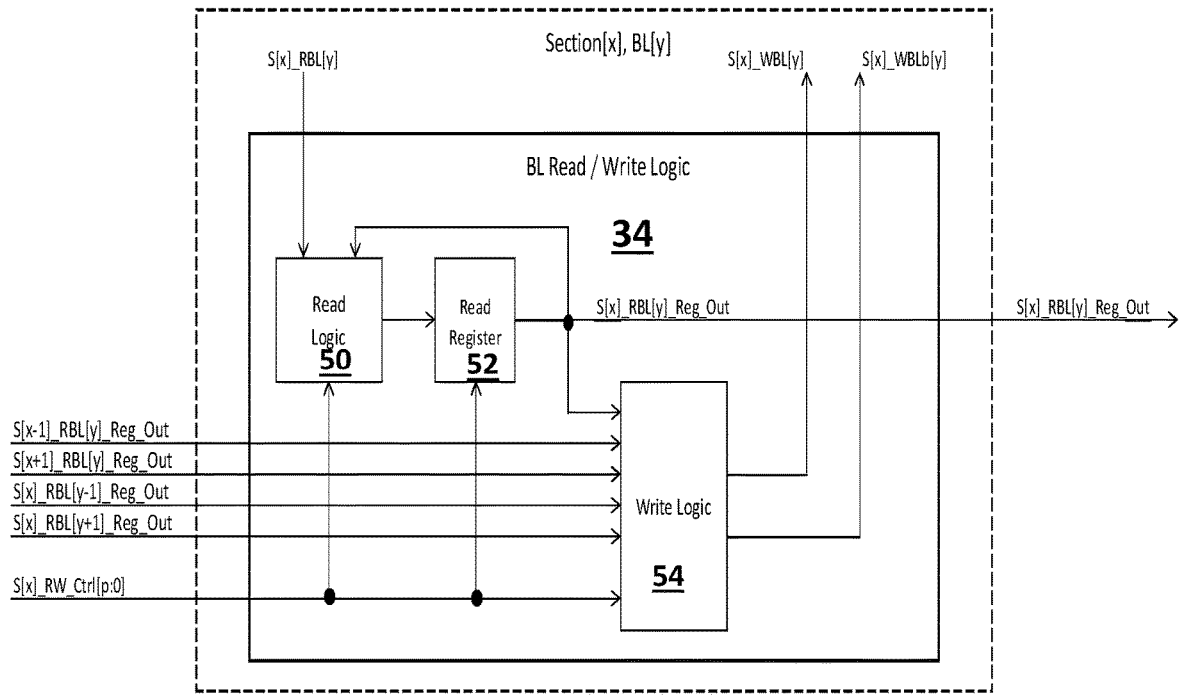
FIG. 6 illustrates the read logic, read data storage, and write logic implemented in a bit line section in a processing array device incorporating computational memory cells.

FIG. 6 illustrates the read logic 50, read data storage 52, and write logic 54 implemented in each bit line section in a processing array device 30 incorporating computational memory cells. As shown in FIG. 6, the particular bit line section may receive read storage outputs from adjacent horizontal and vertical bit line sections (S[x−1]_RBL[y]_Reg_Out, S[x+1]_RBL[y]_Reg_Out, S[x]_RBL[y−1]_Reg_Out and S[x]_RBL[y+1]_Reg_Out) that are input to the write logic 54 along with the control signal as described above. Also as shown in FIG. 6, the output signal from the read storage 52 (S[x]_RBL[y]_Reg_Out) of the particular bit line section may be output to other bit line sections, fed into the write logic 54 and fed back into the read logic 50 for the purposes as described below with reference to FIG. 8.

Figure 7:
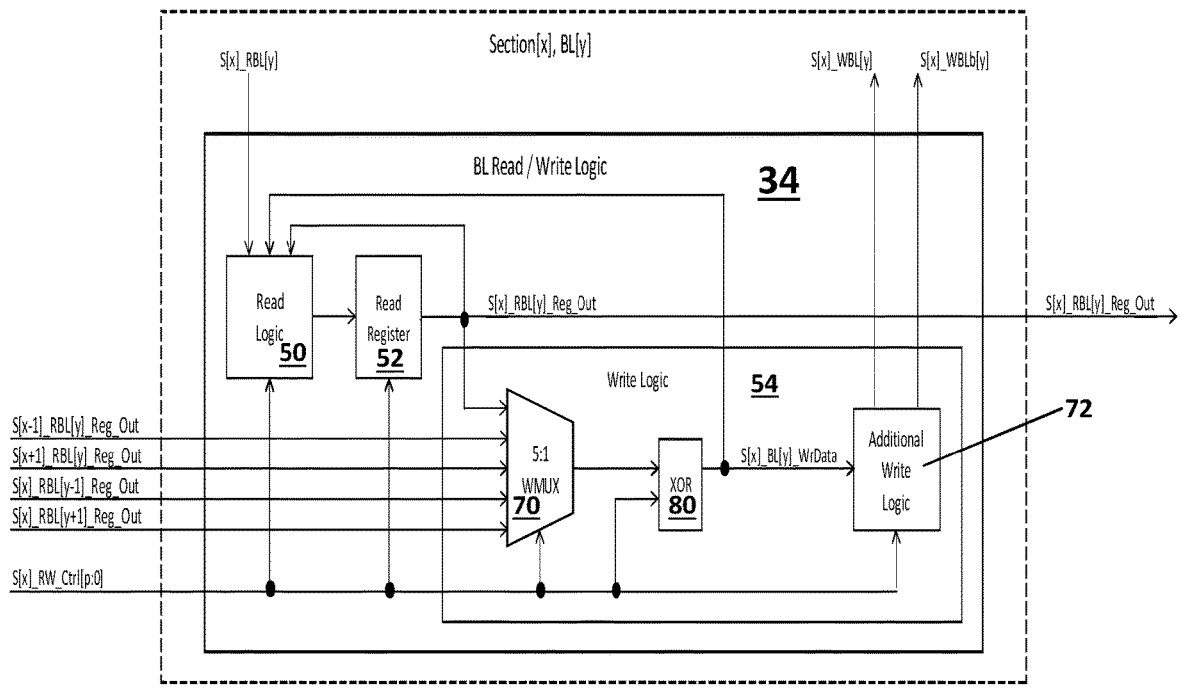
FIG. 7 illustrates further details of the write logic in FIG. 6 and the bit line section's write data feeds into the bit line section's read logic in order to facilitate two read logic circuit implementations.

FIG. 7 illustrates further details of the write logic 54 in FIG. 6 and the bit line section's write data feeds into the bit line section's read logic in order to facilitate two read logic circuit implementations. The read circuitry 50 and read data storage 52 operate and are implemented as described above. In this embodiment, the write circuitry may further include a multiplexer 70, such as a 5:1 write multiplexer for the embodiment in FIG. 7, and additional write circuitry 72 that is connected to the output of the multiplexer 70. The multiplexer 70 is used to select which of the 5 read data storage outputs (including the read data storage output from the particular bit line section and the horizontally and vertically adjacent bit line sections in the array) feeding that write circuitry 54 is used as the write data source to the particular bit line section during a write operation. In the example in FIG. 7, the inputs to the multiplexer may include an output from the read data storage 52 of that bl-sect, the horizontal neighbor bl-sect read data storage outputs (S[x−1]_RBL[y]_Reg_Out and S[x+1]_RBL[y]_Reg_Out) and the vertical neighbor bl-sect read data storage outputs (S[x]_RBL[y−1]_Reg_Out and S[x]_RBL[y+1]_Reg_Out). The RW control signals described above may also include S[x]_wmux_sel[2:0] control signals that are used to control the write mux selection during the write operation. The output of the multiplexer 70 (S[x]_RBL[y]_WMUX_Out) may be fed as a input to a XOR logic gate 80 (along with a control signal) and the output of the XOR logic gate 80 may by input to the additional write circuitry 72 that can write the data to the two word bit lines of the memory cells of the bl-sect and also fed back to the read logic 50. The XOR circuit 80 is controlled by a S[x]_winvert control signal (shown in FIG. 8) that can be used to invert the output write data signal or leave the selected write data uninverted based on the control signal.

Like each other bl-sect, the output of the read storage 52 (the read register) (S[x]_RBL[y]_Reg_Out) is output from the read/write circuitry 34 and also sent to the 4 neighboring bl-sects (except for bl-sects along an edge or at a corner) that may be Section[x−1], BL[y], Sect [x+1], BL[y], Sect [x], BL[y−1] and Sect [x], BL[y+1]. The read/write circuits 34 is a means for swapping/shifting data to adjacent bl-sects. In edge and corner bl-sects, the absent read data storage output connection(s) to their respective write multiplexers (corresponding to the particular neighbor bl-sect(s) that the edge and corner bl-sects lack) can simply be tied off, for example set to a logic "0" so that the same write circuitry 54 with the multiplexer 70 in FIG. 7 may be used for all of the bl-sects.

Figure 8:
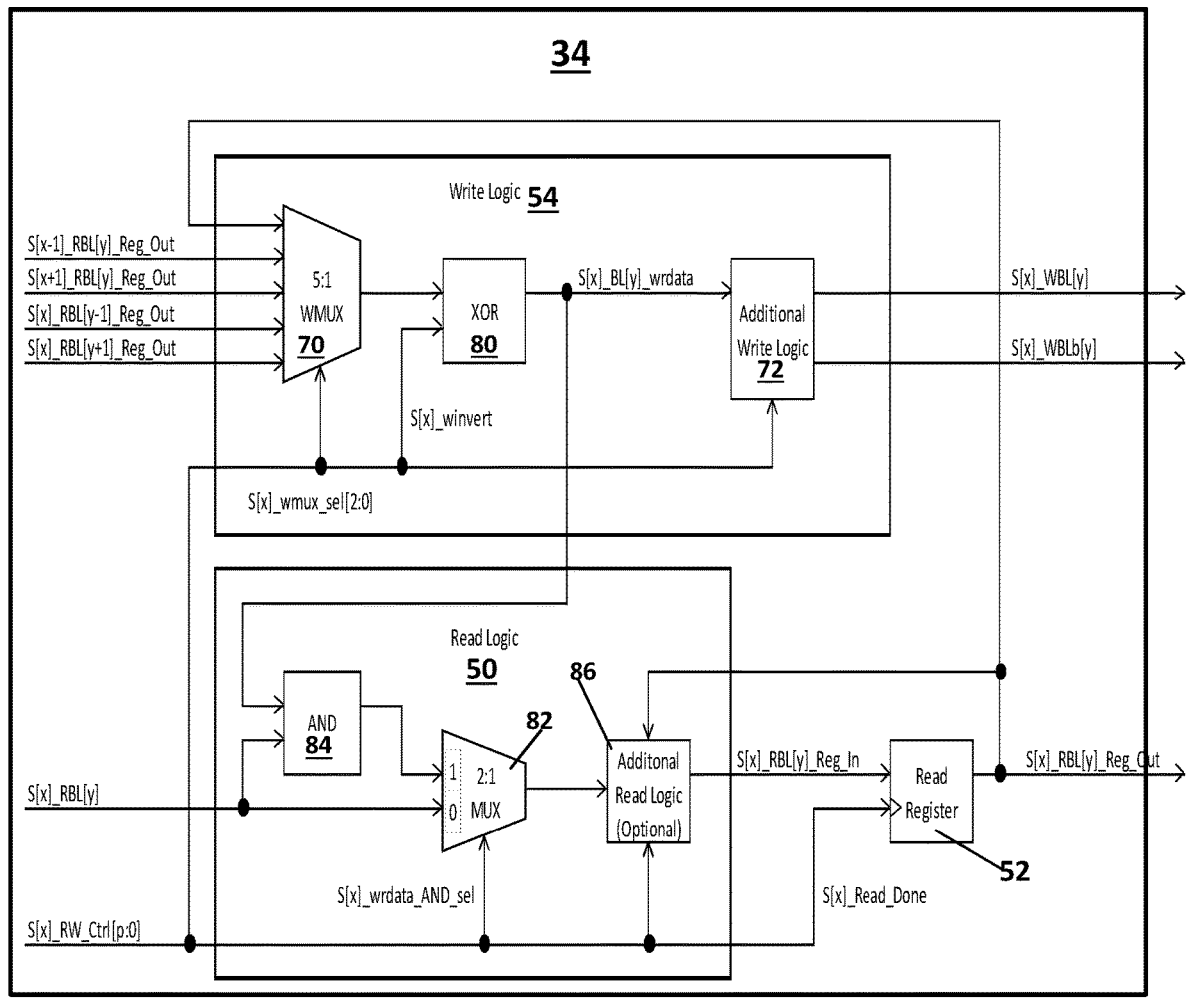
FIG. 8 illustrates a first implementation of the read logic circuit that selects whether the read result on the read bit line alone or the read result on the read bit line logically combined with the bit line section's write data is used as the input to the read data storage, or as the input to additional read logic whose output is the input to the read data storage.

FIG. 8 illustrates a first implementation of the read logic circuit 50 in each read/write logic/circuit 34 within each bit line section that selects whether the read result on the read bit line alone or the read result on the read bit line logically combined with the bit line section's write data is used as the input to the read storage, or as the input to additional read logic whose output is the input to the read storage 52. The read circuitry 50 provides a mechanism to select and logically combine the read result on the bl-sect's read bit line (S[x]_RBL[y]) with the bl-sect's selected write data before the read result is captured and stored in the read storage, or before the read result is input to additional read logic (such as read accumulation logic) whose output is captured and stored in the read storage. In one implementation, the read circuitry 50 may have a selection circuit 82, such as a 2:1 multiplexer, in the bl-sect's read logic 50. The multiplexer 82 may be controlled by a S[x]_wrdata_AND_sel control signal (part of the S[x]_RW Cntrl[p:0] control signals) that is used to control the muxing selection during the read operation. The first data input to the mux 82 is the read result on the read bit line. The second data input to the mux 82 is the read result on the read bit line (S[x]_RBL[y]) logically combined (by a logic gate 84, such as an AND gate) with the bl-sect's selected write data (S[x]_BL[y]_wrdata output from the write mux 70 and the XOR gate 80). The data output of the multiplexer 82 is an input to the read storage 52 or an input to additional read logic 86 whose output (S[x]_RBL[y]_Reg_In) is the input to the read storage. The read storage 52 is being controlled by the same S[x]_Read_Done signal.

The second data input to the mux 82 that is the logical combination of the read bit line result and the write data is the same as the logical function produced when multiple computational cells on the same bit line are read. For example, if reading multiple computational cells on the same bit line produces a logical AND of the cell contents, then the second data input to the mux 82 is the logical AND of the read bit line result and the write data. This circuit in the read logic 50 provides a mechanism to (optionally) treat the bl-sect's write data as if it were another computational cell on the bit line, thereby eliminating the need to store the write data in one of the bl-sect's computational cells before it is utilized in this manner (although the write data may still be stored in a computational cell for later use).

Figure 9:
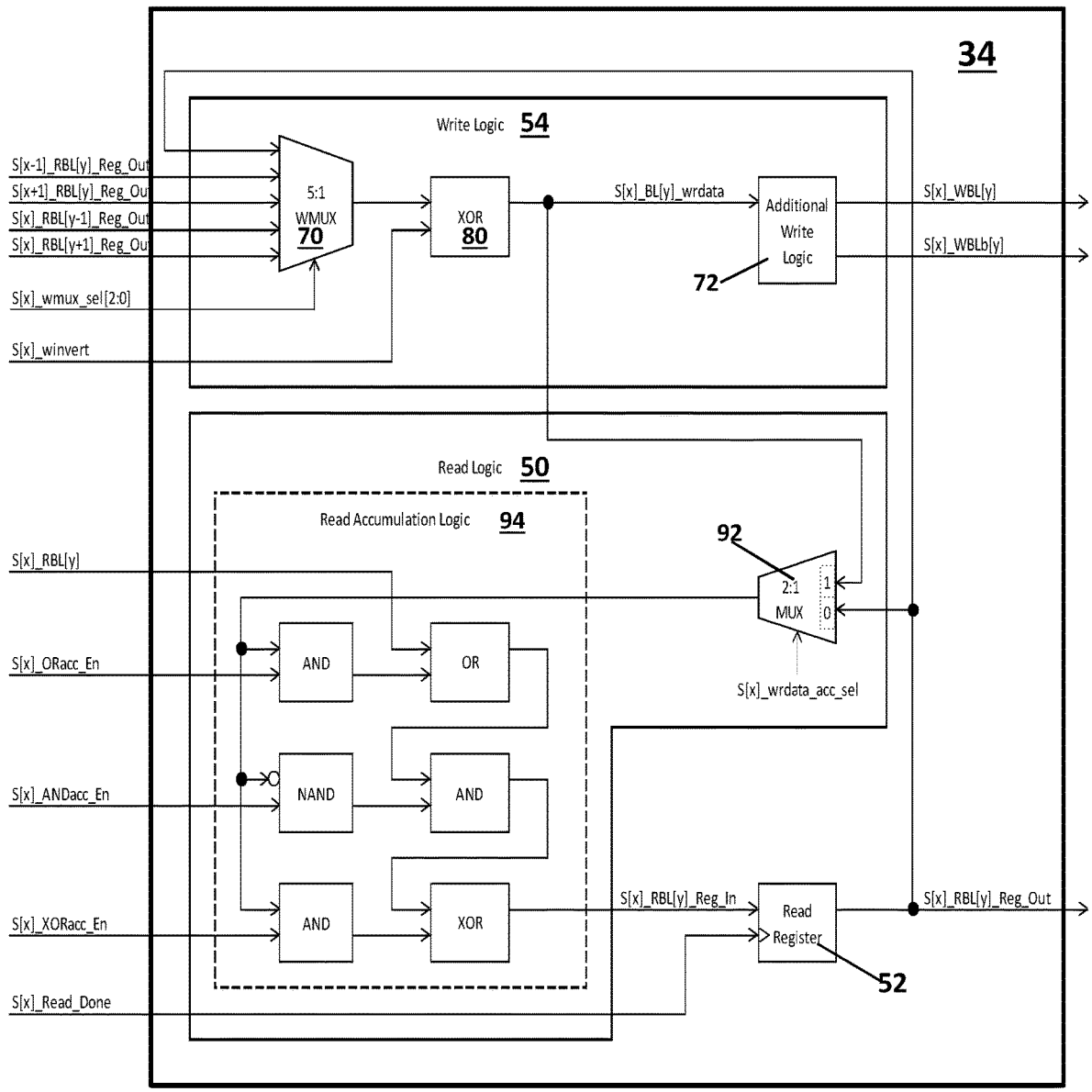
FIG. 9 illustrates a second implementation of the read logic circuit that selects whether the read result on the read bit line accumulates with the bit line section's read data storage output or with the bit line section's write data when read accumulation logic is implemented in the bit line section.

FIG. 9 illustrates a second implementation of the read logic circuit 50 in the read/write logic/circuit 34 of each bit line section that selects whether the read result on the read bit line accumulates with the bit line section's read register output or with the bit line section's write data when read accumulation logic is implemented in the bit line section. This implementation of the read/write circuit 34 includes the elements in common with the implementation of FIG. 8 that have similar reference numbers and similar function and their structure and operation will not be repeated herein since those circuits operate in the same way as described with reference to FIG. 8.

In this embodiment, the read circuit 50 may include a read multiplexer 92 (controlled by a S[x]_wrdata_acc_sel control signal) whose output is connected to set a read accumulation circuitry 94. The output of the read accumulation circuitry 94 is fed to the read storage 52 along with the control signal for the read storage 52. A first data input to the mux 92 is the output (S[x]_RBL[y]_Reg_Out in FIG. 9) of the bl-sect's read storage 52 that is also input to the write multiplexer 70 so that the read storage output signal may be selected by the write multiplexer 70 as the selected write data. A second input of the multiplexer 92 is the bl-sect's selected write data (S[x]_BL[y]_wrdata) and the data output of the mux 92 is an input to the read accumulation logic/circuitry 94.

Conceptually, this circuit provides a mechanism for the read bit line result to accumulate either with the bl-sect's read storage output (as disclosed in Ser. No. 16/111,178 Read Accumulation patent application filed herewith and incorporated by reference herein), or with the read register output from one of the bl-sect's 4 horizontally or vertically adjacent neighbor bl-sects (depending on which one is selected as the bl-sect's write data S[x]_BL[y]_wrdata output from the write multiplexer 70 and the XOR gate 80). In the latter case, the circuit in FIG. 9 eliminates the need to store the write data in one of the bl-sect's computational cells before it is utilized in this manner (although the write data may still be stored in a computational cell for later use). Note that if the write mux 70 in the bl-sect's write logic 54 is controlled to select the bl-sect's read storage 52 output as the write data for the bl-sect, then the mux 92 in the bl-sect's read logic 50 will select the bl-sect's read storage output as the data with which the read bit line result accumulates regardless of the state of the control input to this mux 92. However, the mux 92 is not redundant—its implementation allows for the read bit line result to accumulate with the bl-sect's read register output in cases when the write mux 70 is selecting one of the neighbor bl-sect's read register output as the bl-sect's write data. In this implementation, the read mux 92 is controlled by a S[x]_wrdata_acc_sel control signal that is used to control the mux selection during the read operation.

The read accumulation logic/circuitry 94 may perform an "XOR accumulation", "AND accumulation", and "OR accumulation". In this embodiment, a number of dedicated *acc_En control signals are used to enable each of the accumulations—XOR, AND, and OR such as by using an ORacc_En, an ANDacc_En and an XORacc_En control signals shown in FIG. 9.

Three sets of accumulation circuitry (the AND and OR gates for the OR accumulation, the NAND and AND gates for the AND accumulation and the AND and XOR gates for the XOR accumulation) are chained together as shown in FIG. 9 such that:

The read bit line result "RBL" is the first data input to the OR accumulation circuitry.
The data output of the OR accumulation circuitry is the first data input to the AND accumulation circuitry.
The data output of the AND accumulation circuitry is the first data input to the XOR accumulation circuitry.
The data output of the XOR accumulation circuitry is the data input to the read storage 52.

Although the order in which the accumulation circuits are chained (OR→AND→XOR, as described above) affects the logical function generated by the entire circuit when more than one *acc_En control signal is asserted, it is not an important aspect of this disclosure. Therefore, the disclosure contemplates any order of the accumulation circuitry and any order of the accumulation circuitry is within the scope of this disclosure.

When a read operation is performed with all 3 *acc_En control signals=0, the read storage 52 is loaded with the read bit line result "RBL". When a read operation is performed with one *acc_En=1, the read register is loaded with the read bit line result "RBL" logically combined (either XORed, ANDed, or ORed, depending on which *acc_En=1) with the previous read result (or accumulated read result) stored in the read storage. Other logical functions are generated when a read operation is performed with multiple *acc_En=1.

Figure 10:
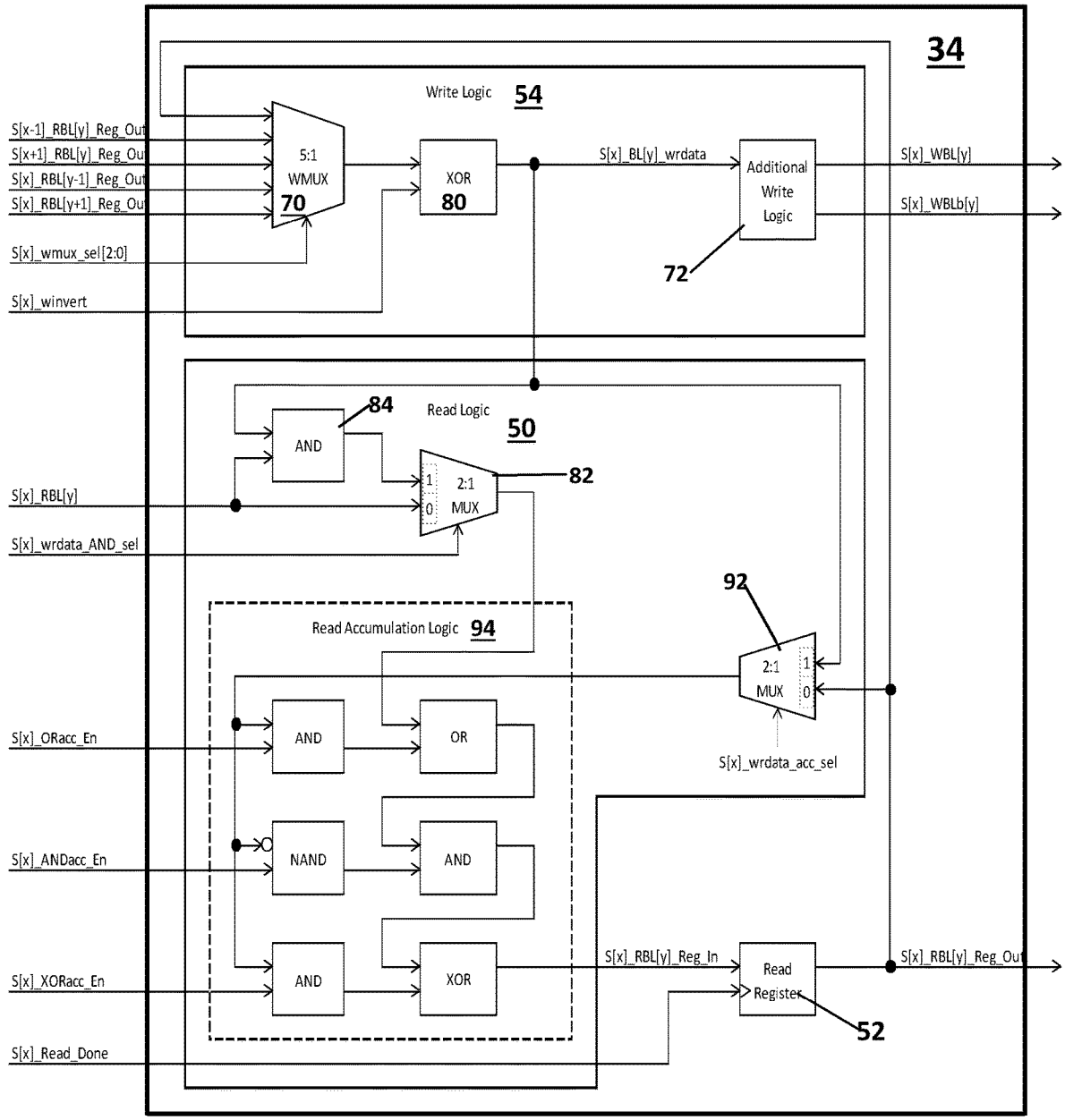
FIG. 10 illustrates a third implementation of the read logic circuit in which the circuitry in FIGS. 8 and 9 are combined together.

FIG. 10 illustrates a third implementation of the read logic circuit 50 in which the circuitry in FIGS. 8 and 9 are combined together. In this implementation, like elements have like numbers and the same operation and function as described above so that their structure and operation will not be repeated here. In this implementation, the combined circuits support both sets of functions that utilize the bl-sect's write data in its read logic. Specifically, FIG. 10 each bl-sect's read logic 50 (including read accumulation logic 94), read storage 52, and write logic 54, in which:

1) a first read multiplexer 82 selects whether the read bit line result (S[x]_RBL[y] for example) alone, or the read bit line result logically ANDed (using the logic gate 84) with the bl-sect's write data (S[x]_BL[y]_wrdata for example), is used as the input to the read storage 52 or as the input to additional real logic 94 whose output is the input to the read storage 52. A wrdata_AND_sel control signal is used to control the mux selection during the read operation.

2) a second read multiplexer 92 is implemented and used in the read logic to select whether the read bit line result accumulates with the bl-sect's read register output, or with the bl-sect's write data (i.e. with the read register output from one of the bl-sect's 4 horizontally or vertically adjacent neighbor bl-sects). A wrdata_acc_sel control signal is used to control the mux selection during the read operation.

For example, the read muxes may be used to perform the following exemplary computation. Suppose bl-sect[0,0] produces a result "x" that has been captured in its read register. Further suppose the computation in question requires that "x" be logically ANDed with the data "a" and "b" in memory cells "A" and "B" in bl-sect[1,0], to produce the result "a AND b AND x". Without the above described first read mux, a system would first have to WRITE the "x" result from bl-sect[0,0] into bl-sect[1,0], let's say into memory cell "C", and then READ memory cells "A", "B", and "C" simultaneously in bl-sect[1,0] to produce the result "a AND b AND x" on its rbl and capture that result in its read register. With the first read mux, the device and processing array READs memory cells "A" and "B" simultaneously in bl-sect[1,0] to produce the result "a AND b" on its rbl, while simultaneously asserting the "wrdata_AND_sel" control signl to the first read mux to produce the result "rbl AND wrdata"="a AND b AND x" in its read logic and capture it in its read register. In the latter case, the "a AND b AND x" result is produced in 1 cycle, rather than in 2 cycles as in the former case, because we don't need to store the "x" result from bl-sect[0,0] into bl-sect[1,0] before using it to produce the desired result.

As another example, suppose bl-sect[0,0] produces a result "x" that has been captured in its read register and the computation requires that "x" be logically XORed with the data "a" in memory cell "A" in bl-sect[1,0], to produce the result "a XOR x". Without the disclosed second read mux, the device must first WRITE the "x" result from bl-sect[0,0] into bl-sect[1,0], let's say into memory cell "C", while simultaneously READing memory cell "A" in bl-sect[1,0] to produce the result "a" on its rbl and capture that result in its read register and then READ memory cell "C" in bl-sect[1,0] to produce a result "x" on its rbl, while simultaneously asserting the "XORacc_En" signal to the read accumulation logic to produce the result "a XOR x" in its read logic and capture it in its read register. With the disclosed second read mux, the device and processing array READs memory cell "A" in bl-sect[1,0] to produce the result "a" on its rbl, while simultaneously asserting the "wrdata_acc_sel" control signal to the second read mux, and while simultaneously asserting the "XORacc_En" control signal to the read accumulation logic, to produce the result "a XOR x" in its read logic and capture it in its read register. In the latter case, the "a XOR x" result is produced in 1 cycle, rather than in 2 cycles as in the former case, because we don't need to store the "x" result from bl-sect[0,0] into bl-sect[1,0] before using it to produce the desired result.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

The system and method disclosed herein may be implemented via one or more components, systems, servers, appliances, other subcomponents, or distributed between such elements. When implemented as a system, such systems may include an/or involve, inter alia, components such as software modules, general-purpose CPU, RAM, etc. found in general-purpose computers. In implementations where the innovations reside on a server, such a server may include or involve components such as CPU, RAM, etc., such as those found in general-purpose computers.

Additionally, the system and method herein may be achieved via implementations with disparate or entirely different software, hardware and/or firmware components, beyond that set forth above. With regard to such other components (e.g., software, processing components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to: software or other components within or embodied on personal computers, servers or server computing devices such as routing/connectivity components, handheld or laptop devices, multiprocessor systems, microprocessor-based systems, set top boxes, consumer electronic devices, network PCs, other existing computer platforms, distributed computing environments that include one or more of the above systems or devices, etc.

In some instances, aspects of the system and method may be achieved via or performed by logic and/or logic instructions including program modules, executed in association with such components or circuitry, for example. In general, program modules may include routines, programs, objects, components, data structures, etc. that performs particular tasks or implement particular instructions herein. The inventions may also be practiced in the context of distributed software, computer, or circuit settings where circuitry is connected via communication buses, circuitry or links. In distributed settings, control/instructions may occur from both local and remote computer storage media including memory storage devices.

The software, circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules and/or other components. Further, communication media may include wired media such as a wired network or direct-wired connection, however no media of any such type herein includes transitory media. Combinations of the any of the above are also included within the scope of computer readable media.

In the present description, the terms component, module, device, etc. may refer to any type of logical or functional software elements, circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive, etc.) to be read by a central processing unit to implement the functions of the innovations herein. Or, the modules can comprise programming instructions transmitted to a general purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, features consistent with the disclosure may be implemented via computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe specific hardware components, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may also be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) though again does not include transitory media. Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the applicable rules of law.

While the foregoing has been with reference to a particular embodiment of the disclosure, it will be appreciated by those skilled in the art that changes in this embodiment may be made without departing from the principles and spirit of the disclosure, the scope of which is defined by the appended claims.

The invention claimed is:

1. A processing array device, comprising:
   a plurality of memory cells arranged in an array having a plurality of columns and a plurality of rows, each memory cell having a storage element wherein the array has a plurality of sections and each section has a plurality of bit line sections and a plurality of bit lines with one bit line per bit line section and each bit line section has a column of the plurality of columns of the plurality of memory cells, wherein the memory cells of the column in each bit line section are all connected to a single read bit line and the plurality of bit lines in each section are distinct from the plurality of bit lines included in the other sections of the array;
   write circuitry, in each bit line section, that receives read data output from a plurality of adjacent bit line sections in the processing array and outputs write data selected to be written to one or more of the memory cells in the bit line section; and
   read circuitry, in each bit line section, that receives read data from the single read bit line of the bit line section and the selected write data, and is configured to route the selected write data and the read data to perform a logical operation with one or more of the read data and the selected write data.

2. The device of claim 1, wherein the read circuitry further comprises read storage that stores the read data from the single read bit line.

3. The device of claim 2, wherein the read circuitry further comprises a multiplexer having a first input connected to the read data from the bit line section and a second input connected to a signal whose value is a logical combination using a logic circuit of the read data from the bit line section with the selected write data.

4. The device of claim 3, wherein the logic circuit that logically combines the read data and the selected write data performs a same logical function implemented when the single read bit line for a plurality of memory cells are read out.

5. The device of claim 3, wherein an output of the multiplexer is input to one of the read storage and a read accumulation logic whose output is input to the read storage.

6. The device of claim 5 further comprising a wrdata_AND_sel control signal that controls the multiplexer during a read operation.

7. The device of claim 2, wherein the read circuitry further comprises a circuit to select one of the read data and a signal whose value is the read data logically combined with the selected write data to input to the read storage.

8. The device of claim 7, wherein the read storage is a read register and the circuit to select is a multiplexer.

9. The device of claim 8, wherein the read circuitry further comprises an AND gate that logically combines the selected write data and the read data.

10. The device of claim 8, wherein the multiplexer has a first input connected to the read data from the bit line section and a second input connected to a signal whose value is a logical combination using an AND gate of the read data from the bit line section with the selected write data.

11. The device of claim 10, wherein the AND gate performs a same logical function implemented when the single read bit line for a plurality of memory cells are read out.

12. The device of claim 11, wherein an output of the multiplexer is input to one of the read storage and read accumulation logic whose output is input to the read storage.

13. The device of claim 7, wherein the write circuitry further comprises a XOR gate that generates one of a non-inverted selected write data and an inverted selected write data.

14. The device of claim 2, wherein the read circuitry further comprises a circuit that accumulates the read data with one of an output of the read storage of the bit line section and the selected write data.

15. The device of claim 14, wherein the circuit that accumulates further comprises a multiplexer and a plurality of logic gates.

16. The device of claim 15, wherein the multiplexer has a first input connected an output of the read storage and a second input is the selected write data.

17. The device of claim 16 further comprising a wrdata_acc_sel control signal that controls the multiplexer during a read operation.

18. The device of claim 14, wherein the write circuitry further comprises a XOR gate that generates one of a non-inverted selected write data and an inverted selected write data.

19. The device of claim 1, wherein the read circuitry further comprises a circuit that accumulates the read data with one of an output of the read storage of the bit line section and the selected write data.

20. The device of claim 19, wherein the accumulation circuit further comprises a multiplexer and a plurality of logic gates.

21. The device of claim 1, wherein the read circuitry further comprises a multiplexer that has a first input connected to an output of the read storage and a second input is the selected write data.

22. The device of claim 21 further comprising a wrdata_acc_sel control signal that controls the multiplexer during a read operation.

23. A processing array device, comprising:

a plurality of memory cells arranged in an array having a plurality of columns and a plurality of rows, each memory cell having a storage element wherein the array has a plurality of sections and each section has a plurality of bit line sections and a plurality of bit lines in the plurality of the bit line sections, wherein the memory cells in each bit line section are all connected to a single read bit line and the plurality of bit lines in each section are distinct from the plurality of bit lines included in the other sections of the array;

write circuitry, in each bit line section, that receives read data output from a plurality of adjacent bit line sections in the processing array and outputs write data selected by a circuit to be written to the one or more of the memory cells in the bit line section;

read circuitry, in each bit line section, that receives read data from the single read bit line of the bit line section and the selected write data and is capable of routing the selected write data and the read data to perform a logical operation with one or more of the read data and the selected write data; and the read circuitry having read storage that stores the read data from the single read bit line, a circuit to select one of the read data and the read data logically combined with the selected write data to input to the read storage, and a circuit that accumulates the read data with one of an output of the read storage of the bit line section and the selected write data.

24. The device of claim 23, wherein the read storage is a read register and the circuit to select is a first multiplexer and a second multiplexer.

25. The device of claim 24, wherein the read circuitry further comprises an AND gate that logically combines the selected write data and the read data.

26. The device of claim 24, wherein the circuit that accumulates further comprises a first and second multiplexer and a plurality of logic gates.

27. The device of claim 26, wherein the first and second multiplexers that accumulates has a first input connected an output of the read storage and a second input is the selected write data.

28. The device of claim 24, wherein the first and second multiplexers each have a first input connected to the read data from the bit line section and a second input connected to a signal whose value is a logical combination of the read data from the bit line section with the selected write data.

29. The device of claim 28, wherein an output of the first and second multiplexers are each input to one of the read storage and read accumulation logic whose output is input to the read storage.

30. The device of claim 23, wherein the write circuitry further comprises a XOR gate that generates one of a non-inverted selected write data and an inverted selected write data.

* * * * *